(12) United States Patent
Lee et al.

(10) Patent No.: US 12,719,029 B2
(45) Date of Patent: Aug. 25, 2026

(54) SUBSTRATE PROCESSING APPARATUS

(71) Applicant: SAMSUNG ELECTRONICS CO., LTD., Suwon-si (KR)

(72) Inventors: Hyunjae Lee, Suwon-si (KR); Hyun Bae Kim, Suwon-si (KR); Sang Ki Nam, Suwon-si (KR); Hansin Bae, Suwon-si (KR); Junghwan Um, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 18/789,045

(22) Filed: Jul. 30, 2024

(65) Prior Publication Data

US 2025/0210322 A1 Jun. 26, 2025

(30) Foreign Application Priority Data

Dec. 26, 2023 (KR) ........................ 10-2023-0191738

(51) Int. Cl.
*H01J 37/32* (2006.01)

(52) U.S. Cl.
CPC .. *H01J 37/32697* (2013.01); *H01J 37/32568* (2013.01); *H01J 37/32715* (2013.01); *H01J 2237/334* (2013.01)

(58) Field of Classification Search
None
See application file for complete search history.

(56) References Cited

U.S. PATENT DOCUMENTS 10,474,184 B2 11/2019 Kim et al.
11,495,470 B1 11/2022 Zhou et al.
2021/0305025 A1 9/2021 Tamura et al.
2021/0366723 A1* 11/2021 Voronin ............ H01J 37/32137
2022/0037121 A1* 2/2022 Dorf ................. H01J 37/32128
2022/0157577 A1 5/2022 Cui et al.
2022/0399184 A1 12/2022 Cui et al.
2022/0399193 A1 12/2022 Cui et al.
2022/0406567 A1 12/2022 Yang et al.
2024/0290578 A1* 8/2024 Ramaswamy ........ H01J 37/321

FOREIGN PATENT DOCUMENTS

CN 111128666 * 5/2020 ......... H01L 21/6875

OTHER PUBLICATIONS

English language translation of Cheng et al, CN 111128666 (May 8, 2020).*

* cited by examiner

*Primary Examiner* — Kenneth B Wells
(74) *Attorney, Agent, or Firm* — Sughrue Mion, PLLC

(57) ABSTRACT

Provided is a substrate processing apparatus including a chamber, a support member inside the chamber, a center bias electrode at an inner center region of the support member, an edge bias electrode at an inner edge region of the support member, a center power supply unit connected to the center bias electrode and configured to output a center start voltage at a start point of a control period and a center end voltage at an end point of the control period, and an edge power supply unit connected to the edge bias electrode and configured to output an edge start voltage at the start point and an edge end voltage at the end point, wherein a value obtained by subtracting the edge start voltage from the edge end voltage is greater than a value obtained by subtracting the center start voltage from the center end voltage.

20 Claims, 21 Drawing Sheets

SUBSTRATE PROCESSING APPARATUS

CROSS-REFERENCE TO RELATED APPLICATION

This application claims priority to Korean Patent Application No. 10-2023-0191738 filed in the Korean Intellectual Property Office on Dec. 26, 2023, the disclosure of which is incorporated herein in its entirety by reference.

BACKGROUND

1. Field

Embodiments of the present disclosure relate to a substrate processing apparatus.

2. Description of Related Art

To manufacture semiconductor devices, various processes such as photolithography, etching, ashing, ion implantation, thin film deposition, and cleaning are performed on a substrate to form a desired pattern on the substrate. Among these, the etching process is a process of removing a selected heating area from a film formed on the substrate, and, for example, wet etching and dry etching may be used.

An etching apparatus using plasma is used for dry etching. In order to generate plasma, an electromagnetic field is generated in the internal space of the chamber, and the electromagnetic field excites process gases provided in the chamber into a plasma state.

Plasma refers to an ionized gas state composed of ions, electrons, radicals, etc. Plasma is generated by very high temperatures, strong electric fields, or high-frequency electromagnetic fields (RF electromagnetic fields). The semiconductor device manufacturing process uses plasma to perform an etching process. The etching process is performed by ion particles contained in plasma colliding with the substrate.

SUMMARY

One or more embodiments provide a substrate processing apparatus capable of more effectively processing a substrate using plasma.

One or more embodiments also provide a substrate processing apparatus that can effectively process a substrate through plasma.

However, the problems to be solved by embodiments of the present disclosure are not limited to the above-described problems and may be expanded in various ways within a range of the technical idea included in the present disclosure.

According to an aspect of one or more embodiments, there is provided a substrate processing apparatus including a chamber, a support member inside the chamber, a center bias electrode at an inner center region of the support member, an edge bias electrode at an inner edge region of the support member, a center power supply unit connected to the center bias electrode and configured to output a center start voltage at a start point of a control period and a center end voltage at an end point of the control period, and an edge power supply unit connected to the edge bias electrode and configured to output an edge start voltage at the start point and an edge end voltage at the end point, wherein a value obtained by subtracting the edge start voltage from the edge end voltage is greater than a value obtained by subtracting the center start voltage from the center end voltage.

According to another aspect of one or more embodiments, there is provided a substrate processing apparatus including a chamber, a support member inside the chamber, a center bias electrode at an inner center region of the support member, an edge bias electrode at an inner edge region of the support member, a center power supply unit connected to the center bias electrode and configured to output a center start voltage at a start point of a control period and a center end voltage at an end point of the control period, and an edge power supply unit connected to the edge bias electrode and configured to output an edge start voltage at the start point and an edge end voltage at the end point, wherein an angle of a straight line from the edge start voltage to the edge end voltage is greater than an angle of a straight line from the center start voltage to the center end voltage.

According to still another aspect of one or more embodiments, there is provided a substrate processing apparatus including a chamber including a process space, a support member inside the chamber, a plasma excitation member configured to apply energy to excite plasma to the process space, a center bias electrode at the inner central region of the support member, an edge bias electrode at an inner edge region of the support member, a center power supply unit connected to the center bias electrode and configured to output a center start voltage at a start point of a control period and a center end voltage at an end point of the control period, and an edge power supply unit connected to the edge bias electrode and configured to output an edge start voltage at the start point and an edge end voltage at the end point, wherein a value obtained by subtracting the edge start voltage from the edge end voltage is greater than a value obtained by subtracting the center start voltage from the center end voltage, and an absolute value of the edge start voltage is greater than an absolute value of the center start voltage.

BRIEF DESCRIPTION OF DRAWINGS

The above and other aspects, features, and advantages of one or more embodiments of the disclosure will be more apparent from the following description taken in conjunction with the accompanying drawings, in which.

DETAILED DESCRIPTION

Figure 1:
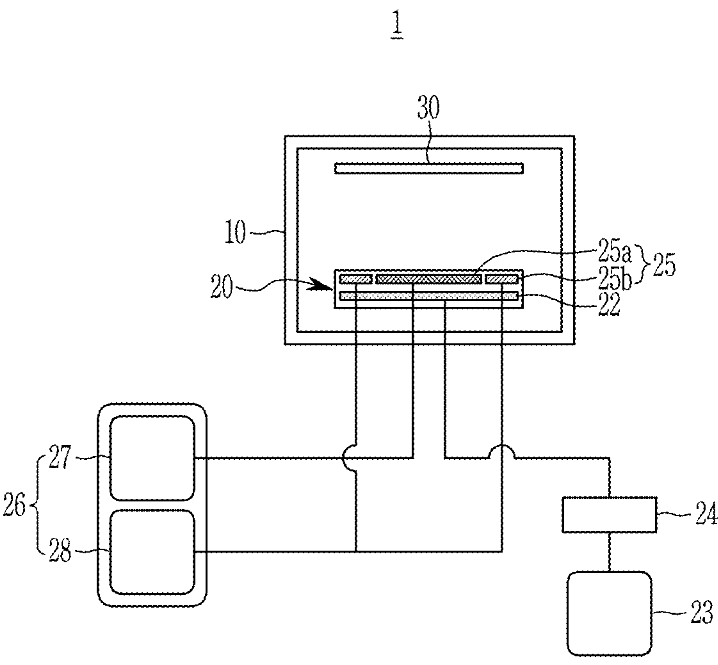
FIG. 1 is a drawing illustrating a substrate processing apparatus according to one or more embodiments.

Hereinafter, with reference to accompanying drawings, various embodiments of the present disclosure will be described in detail so that a person of an ordinary skill can easily implement the present disclosure. The present disclosure may be implemented in many different forms and is not limited to the embodiments described herein.

In order to clearly explain the present disclosure, parts that are not relevant to the description are omitted, and identical or similar components are assigned the same reference numerals throughout the specification.

In addition, the size and thickness of each component shown in the drawings are shown arbitrarily for convenience of explanation, so the present disclosure is not necessarily limited to what is shown. In the drawings, the thickness of layers, films, panels, regions, etc., are exaggerated for clarity. And in the drawings, for convenience of explanation, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, being "on" or "above" a reference element means being disposed on or below the reference element, and does not necessarily mean being disposed "above" or "on" in a direction opposite to gravity.

In addition, unless explicitly described to the contrary, the word "comprise", and variations such as "comprises" or "comprising", will be understood to imply the inclusion of stated elements but not the exclusion of any other elements.

FIG. 1 is a drawing illustrating a substrate processing apparatus 1 according to one or more embodiments.

Referring to FIG. 1, a substrate processing apparatus 1 according to one or more embodiments includes a chamber 10, a support member 20, a plasma excitation member 30, and a bias power supply unit 26.

The substrate processing apparatus 1 processes a substrate using plasma. For example, the substrate processing apparatus 1 may perform an etching process, etc. using excited plasma. The substrate may be, for example, a wafer for manufacturing semiconductor devices.

The chamber 10 provides a process space within which a substrate processing is performed. The chamber 10 has an internal process space and may be provided in a closed and sealed shape. The chamber 10 may be made of, for example, a metal material. As an example, the chamber 10 may be made of aluminum material. The chamber 10 may be grounded.

The support member 20 is disposed inside the chamber 10. The support member 20 may be disposed at a lower portion of the process space in the chamber 10. The support member 20 may support the substrate. The support member 20 may adsorb the substrate using electrostatic force. The support member 20 may include a plurality of components. The support member 20 may include an electrostatic chuck and a focus ring. The electrostatic chuck may be disposed on an upper portion of the support member 20. Accordingly, the substrate may be positioned on an upper surface of the electrostatic chuck. The upper surface of the electrostatic chuck may be made of, for example, a dielectric material. The focus ring may be disposed in an upper outer (peripheral) area of the support member 20. The focus ring may be disposed on an outer circumference of the upper portion of the electrostatic chuck.

A plasma excitation electrode 22 may be disposed inside the support member 20. The plasma excitation electrode 22 may be made of, for example, a metal material. A source power supply unit 23 may be electrically connected to the plasma excitation electrode 22. The source power supply unit 23 may be provided as a high-frequency power source that generates relatively high-frequency power. The source power supply unit 23 may be provided as a radio frequency (RF) power source. A matcher 24 may be disposed between the source power supply unit 23 and the plasma excitation electrode 22. The matcher 24 may perform impedance matching between the source power supply unit 23 and the plasma excitation electrode 22. Additionally, the source power supply unit 23 may be omitted, and the plasma excitation electrode 22 may be grounded.

A bias electrode 25 may be disposed inside the support member 20. The bias electrode 25 may be disposed inside an upper portion of the support member 20 with respect to the plasma excitation electrode 22.

The bias electrode 25 includes a center bias electrode **25*a* and an edge bias electrode 25*b*. The center bias electrode 25*a* may be disposed in an inner center region of the support member 20. The edge bias electrode 25*b* may be disposed in an inner edge region of support member 20. The edge bias electrode 25*b* may be disposed below an edge region of the upper surface of the support member 20. The edge bias electrode 25*b* may be disposed on an outer circumference of the center bias electrode 25*a*. For example, the edge bias electrode 25*b*** may have a ring shape.

The bias power supply unit 26 may be connected to the bias electrode 25. The state of the sheath in a region adjacent to the upper surface of the support member 20, a state of plasma concentration with respect to the substrate, a state of ion incidence to the substrate, and the like may be adjusted by the power supplied by the bias power supply unit 26. The frequency of the bias power supply unit 26 is to be smaller than the frequency of the source power supply unit 23. For example, the frequency of the source power supply unit 23 may be 50 MHz to hundreds of MHz, and the frequency of the bias power supply unit 26 may be 0.1 MHz to 15 MHz. The bias power supply unit 26 may enable a non-sinusoidal voltage to be applied to the bias electrode 25.

The bias power supply unit 26 includes a center power supply unit 27 and an edge power supply unit 28. The center power supply unit 27 is connected to the center bias electrode **25*a*. The edge power supply unit 28 is connected to the edge bias electrode 25*b***.

The plasma excitation member 30 enables energy for excitation of plasma to be applied to the process space. The plasma excitation member 30 may be disposed inside the chamber 10. For example, the plasma excitation member 30 may be manufactured separate from the chamber 10 and connected to the chamber 10. According to another embodiment, the plasma excitation member 30 may be provided integrally with an upper structure of the chamber 10. For example, the upper structure of the chamber 10 may function as the plasma excitation member 30.

The plasma excitation member 30 may be disposed at an upper portion of the process space with respect to the support member 20. The plasma excitation member 30 may be provided to have a predetermined area and made of a conductive material. The plasma excitation member 30 may be disposed to face the support member 20 in a vertical direction.

The process gas introduced into the chamber 10 may be excited into plasma by an electric field formed inside the chamber 10. For example, the process gas may be excited into plasma by a capacitively coupled plasma (CCP) source. The capacitively coupled plasma source may include an upper electrode and a lower electrode. The upper electrode and the lower electrode may be arranged in a vertical direction to face each other inside the chamber 10. By applying high-frequency power to at least one of the upper electrodes and the lower electrode, an electromagnetic field is generated in a space between the upper electrode and the lower electrode, and the process gas supplied to the space between the upper electrode and the lower electrode may be excited into a plasma state.

The upper electrode may be the plasma excitation member 30, and the lower electrode may be the plasma excitation electrode 22. The high-frequency power source may be connected to only one of the upper electrode and the lower electrode. For example, the upper electrode may be grounded, and the high-frequency power source may be connected only to the lower electrode. Also, the lower electrode may be grounded, and the high-frequency power source may be connected only to the upper electrode. Also, a high-frequency power source may be connected to both the upper electrode and lower electrode. FIG. 1 illustrates an example that a high-frequency power source is connected to the lower electrode.

Hereinafter, the output voltage of the bias power supply unit 26 will be described in FIG. 2 to FIG. 10. The output voltages Vout1, Vout1*a*, Vout1*b*, Vout1*c*, Vout1*d*, Vout1*e*, Vout1*f*, Vout1*g*, Vout1*h* of the center power supply unit 27 are shown at the top, and the output voltages Vout2, Vout2*a*, Vout2*b*, Vout2*c*, Vout2*d*, Vout2*e*, Vout2*f*, Vout2*g*, Vout2*h* of the edge power supply unit 28 are shown at bottom. The horizontal axis represents time, and the vertical axis represents output voltage.

The magnitude of the voltage is used considering the relationship between positive values and negative values. Accordingly, positive values are greater than negative values. For two negative values, a negative value having a greater absolute value is lower than a negative value having a smaller absolute value.

Also, an angle is used considering the relationship between positive values and negative values. An angle is measured to have an acute angle with an axis parallel to the time axis. For example, when an angle is positioned in the first quadrant with respect to a direction parallel to the time axis, the angle is measured counterclockwise and has a positive value, and when an angle is positioned in the fourth quadrant, the angle is measured clockwise and has a negative value. The positive value of the angle is greater than the negative value. Also, for two angles having negative values, a negative value having a greater absolute value is lower than a negative value having a smaller absolute value.

Additionally, overshoot values and noise components that may appear when measuring an actual output waveform may be included in the voltage waveforms illustrated in the FIGS. 2 to 10.

Figure 2:
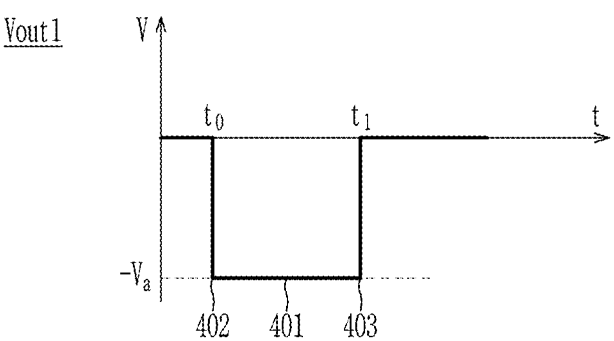
FIGS. 2, 3, 4, 5, 6, 7, 8, 9, and 10 illustrate the output voltage of the bias power supply unit according to one or more embodiments.
Figure 2:
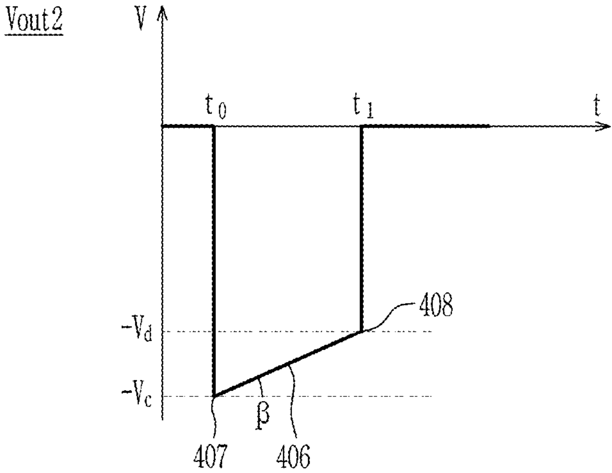

FIG. 2 is a drawing illustrating the waveform of the output voltage according to one or more embodiments of the bias power supply unit 26.

FIG. 2 illustrates a part of one cycle of the output voltage Vout1 of the center power supply unit 27 and the output voltage Vout2 of the edge power supply unit 28.

Referring to FIG. 2, the waveform of the output voltage Vout1 of the center power supply unit 27 may be a non-sinusoidal wave. The center power supply unit 27 may output a center control voltage 401 in a control period of one cycle. The center control voltage 401 may be a negative value. The control period may be positioned between a start point $t_0$ and an end point $t_1$. At the start point $t_0$ when the center control voltage 401 starts, the value of the center control voltage 401 may be the center start voltage 402. At the end point $t_1$ when the center control voltage 401 ends, the value of the center control voltage 401 may be the center end voltage 403. The magnitude −Va of the center start voltage 402 and the center end voltage 403 may be the same. Accordingly, a value subtracting the center start voltage 402 from the center end voltage 403 may be 0V. Additionally, the angle of a straight line from the center start voltage 402 to the center end voltage 403 may have a first slope value of 0°.

The output voltage Vout1 of the center power supply unit 27 may be a center reference voltage before the start point of the control period. The output voltage Vout1 of the center power supply unit 27 may be the center reference voltage after the end point of the control period. For example, the output voltage Vout1 of the center power supply unit 27 may be output during a reference period in a remaining period of one cycle other than the control period. The output voltage Vout1 of the center power supply unit 27 may be the center reference voltage in the reference period. The center reference voltage may be greater than the center control voltage 401. An absolute value of the center reference voltage may be smaller than an absolute value of the center control voltage 401. The center reference voltage may be 0V. The output voltage Vout1 of the center power supply unit 27 may be a square wave that varies between 0V and the center control voltage 401.

The waveform of the output voltage Vout2 of the edge power supply unit 28 may be a non-sinusoidal wave. The edge power supply unit 28 may output the edge control voltage 406 during a control period of one cycle. The edge control voltage 406 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point t0 when the edge control voltage 406 starts, the value of the edge control voltage 406 may be the edge start voltage 407. The edge start voltage 407 is lower than the center start voltage 402. For example, the absolute value Vc of the edge start voltage 407 is greater than the absolute value Va of the center start voltage 402. At the end point t1 when the edge control voltage 406 ends, the value of the edge control voltage 406 may be the edge end voltage 408. The magnitude-Vc of the edge start voltage 407 and the magnitude −Vd of the edge end voltage 408 may be different. The level −Vc of the edge start voltage 407 is lower than the level −Vd of the edge end voltage 408. For example, the absolute value Vc of the edge start voltage 407 is greater than the absolute value Vd of the edge end voltage 408. The edge control voltage 406 may have a shape of positive slope rising from the edge start voltage 407 to the edge end voltage 408. Accordingly, a value obtained by subtracting the edge start voltage 407 from the edge end voltage 408 has a positive value. The angle of the straight line from the edge start voltage 407 to the edge end voltage 408 may have a second slope value β that is a positive value.

And, a value obtained by subtracting the edge start voltage 407 from the edge end voltage 408 is greater than a value subtracting the center start voltage 402 from the center end voltage 403. Additionally, the positive second slope value β is greater than the first slope value of 0°. For example, the straight line from the edge start voltage 407 to the edge end voltage 408 may be a shape rotated at an angle of less than 90° counterclockwise with respect to the straight line from the center start voltage 402 to the center end voltage 403.

The output voltage Vout2 of the center edge power supply unit 27 may be an edge reference voltage before the start point of the control period. The output voltage Vout2 of the edge power supply unit 28 may be the edge reference voltage after the end point of the control period. For example, the output voltage Vout2 of the edge power supply unit 28 may be a reference period in a remaining period other than the control period of the one cycle. The output voltage Vout2 of the edge power supply unit 28 may be the edge reference voltage in the reference period. The edge reference voltage may be greater than the edge control voltage 406. An absolute value of the edge reference voltage may be smaller than an absolute value of the edge control voltage 406. The edge reference voltage may be 0V.

Figure 3:
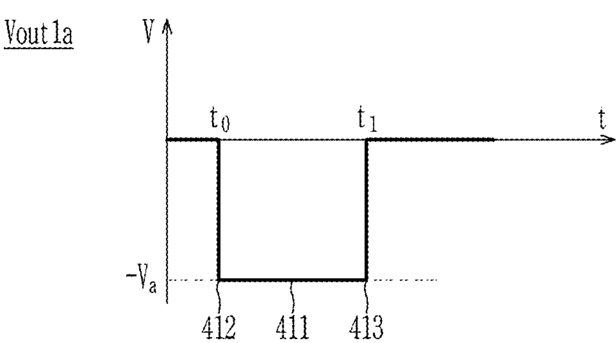
Figure 3:
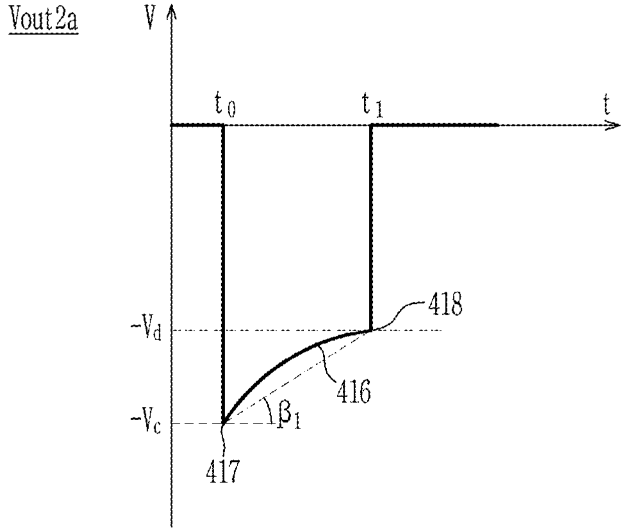

FIG. 3 is a drawing illustrating the waveform of the output voltage according to another embodiment of the bias power supply unit 26.

FIG. 3 illustrates a part of one cycle of the output voltage Vout1*a* of the center power supply unit 27 and the output voltage Vout2*a* of the edge power supply unit 28.

Referring to FIG. 3, the waveform of the output voltage Vout1*a* of the center power supply unit 27 may be a non-sinusoidal wave. The center power supply unit 27 may output the center control voltage 411 in a control period of one cycle. The center control voltage 411 may be a negative value. The control period may be positioned between the start point t0 and the end point t1. At the start point t0 when the center control voltage 411 starts, the value of the center control voltage 411 may be the center start voltage 412. At the end point t1 when the center control voltage 411 ends, the value of the center control voltage 411 may be the center end voltage 413. The magnitude −Va of the center start voltage 412 and the center end voltage 413 may be the same. Accordingly, a value obtained by subtracting the center start voltage 412 from the center end voltage 413 may be 0V. Additionally, the angle of a straight line from the center start voltage 412 to the center end voltage 413 may have a first slope value of 0.

The output voltage Vout1*a* of the center power supply unit 27 may be the center reference voltage before the start point of the control period. The output voltage Vout1*a* of the center power supply unit 27 may be the center reference voltage after the end point of the control period. For example, the output voltage Vout1*a* of the center power supply unit 27 may be a reference period in a remaining period other than the control period of the one cycle. The output voltage Vout1*a* of the center power supply unit 27 may be the center reference voltage in the reference period. The center reference voltage may be greater than the center control voltage 411. An absolute value of the center reference voltage may be smaller than an absolute value of the center control voltage 411. The center reference voltage may be 0V. The output voltage Vout1*a* of the center power supply unit 27 may be a square wave that varies between 0V and the center control voltage 411.

The waveform of the output voltage Vout2*a* of the edge power supply unit 28 may be a non-sinusoidal wave. The edge power supply unit 28 may output the edge control voltage 416 in a control period of one cycle. The edge control voltage 416 may be a negative value. The control period may be positioned between the start point t0 and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 416 starts, the value of the edge control voltage 416 may be the edge start voltage 407. The edge start voltage 417 is lower than the center start voltage 412. For example, the absolute value Vc of the edge start voltage 417 is greater than the absolute value Va of the center start voltage 412. At the end point $t_1$ when the edge control voltage 416 ends, the value of the edge control voltage 416 may be the edge end voltage 418. The magnitude −Vc of the edge start voltage 417 and the magnitude −Vd of the edge end voltage 418 may be different. The level of the edge start voltage 417 −Vc is lower than the level of the edge end voltage 418 −Vd. For example, the absolute value Vc of the edge start voltage 417 is greater than the absolute value Vd of the edge end voltage 418. The edge control voltage 416 may have a curved shape in at least a part between the edge start voltage 417 and the edge end voltage 418. The edge control voltage 416 may have a curved shape that is convex upward in at least a part between the edge start voltage 417 and the edge end voltage 418. For example, the edge control voltage 416 may have a curved shape that is convex upward between the edge start voltage 417 and the edge end voltage 418. Accordingly, the value obtained by subtracting the edge start voltage 417 from the edge end voltage 418 has a positive value. Also, the angle of the straight line from the edge start voltage 417 to the edge end voltage 418 may have a second slope value $\beta_1$ that is a positive value.

In addition, a value obtained by subtracting the edge start voltage 417 from the edge end voltage 418 is greater than a value obtained by subtracting the center start voltage 412 from the center end voltage 413. Additionally, the positive second slope value β1 is greater than the first slope value of 0°. For example, the straight line from the edge start voltage 417 to the edge end voltage 418 may be a shape rotated at an angle of less than 90° counterclockwise with respect to the straight line from the center start voltage 412 to the center end voltage 413.

The output voltage Vout2*a* of the edge power supply unit 28 may be the edge reference voltage before the start point of the control period. The output voltage Vout2*a* of the edge power supply unit 28 may be the edge reference voltage after the end point of the control period. For example, the output voltage Vout2*a* of the edge power supply unit 28 may be a reference period in a remaining period other than the control period of the one cycle. The output voltage Vout2*a* of edge power supply unit 28 may have the edge reference voltage in the reference period. The edge reference voltage may be greater than the edge control voltage 416. An absolute value of the edge reference voltage may be smaller than an absolute value of the edge control voltage 416. The edge reference voltage may be 0V.

Figure 4:
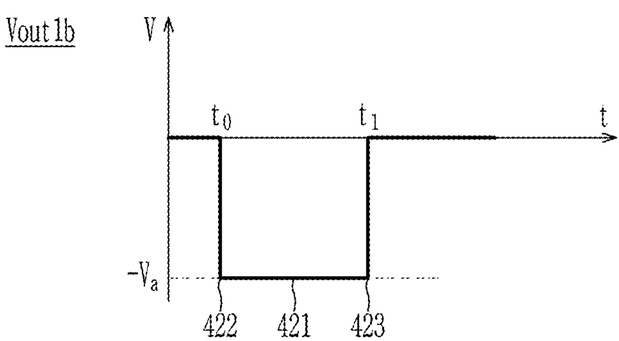
Figure 4:
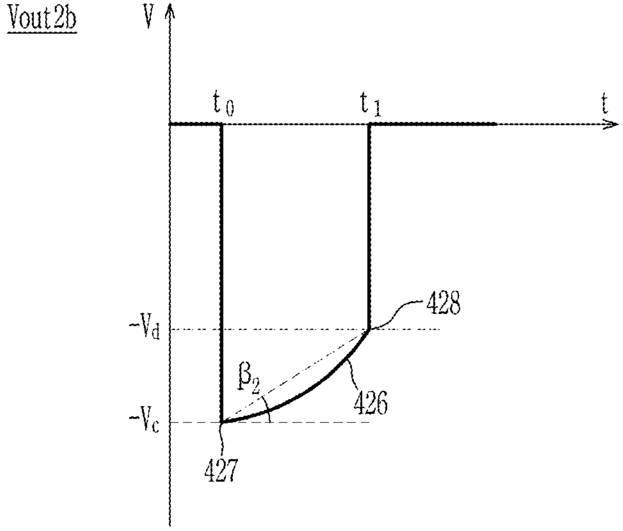

FIG. 4 is a drawing illustrating the waveform of the output voltage according to another embodiment of the bias power supply unit 26.

FIG. 4 illustrates a part of one cycle of the output voltage Vout1*b* of the center power supply unit 27 and the output voltage Vout2*b* of the edge power supply unit 28.

Referring to FIG. 4, the waveform of the output voltage Vout1*b* of the center power supply unit 27 may be a non-sinusoidal wave. The center power supply unit 27 may output the center control voltage 421 in a control period of one cycle. The center control voltage 421 may be a negative value. The control period may be positioned between the start point $t_0$ and the end point $t_1$. At the start point $t_0$ when the center control voltage 421 starts, the value of the center control voltage 421 may be the center start voltage 422. At the end point $t_1$ when the center control voltage 401 ends, the value of the center control voltage 421 may be the center end voltage 423. The magnitude of the center start voltage 422 and the center end voltage 423 may be the same. Accordingly, a value obtained by subtracting the center start voltage 422 from the center end voltage 423 may be 0V. Additionally, the angle of a straight line from the center start voltage 422 to the center end voltage 423 may have a first slope value of 0°.

The output voltage Vout1*b* of the center power supply unit 27 may be the center reference voltage before the start point of the control period. The output voltage Vout1*b* of the center power supply unit 27 may be the center reference voltage after the end point of the control period. For example, the output voltage Vout1*b* of the center power supply unit 27 may be a reference period in a remaining period other than the control period of the one cycle. The output voltage Vout1*b* of the center power supply unit 27 may be the center reference voltage in the reference period. The center reference voltage may be greater than the center control voltage 421. An absolute value of the center reference voltage may be smaller than an absolute value of the center control voltage 421. The center reference voltage may be 0V. The output voltage Vout1*b* of the center power supply unit 27 may be a square wave that varies between 0V and the center control voltage 401.

The waveform of the output voltage Vout2*b* of the edge power supply unit 28 may be a non-sinusoidal wave. The edge power supply unit 28 may output the edge control voltage 426 in the control period of one cycle. The edge control voltage 426 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 426 starts, the value of the edge control voltage 426 may be the edge start voltage 427. The edge start voltage 427 is smaller than the center start voltage 422. For example, the absolute value Vc of the edge start voltage 427 is greater than the absolute value Va of the center start voltage 422. At the end point $t_1$ when the edge control voltage 426 ends, the value of the edge control voltage 426 may be the edge end voltage 428. The magnitude of the edge start voltage 427 and the edge end voltage 428 may be different. The magnitude −Vc of the edge start voltage 427 is smaller than the magnitude −Vd of the edge end voltage 428. For example, the absolute value Vc of the edge start voltage 427 is greater than the absolute value Vd of the edge end voltage 428. The edge control voltage 426 may have a curved shape in at least a part between the edge start voltage 427 and the edge end voltage 428. The edge control voltage 426 may have a curved shape that is convex downward in at least a part between the edge start voltage 427 and the edge end voltage 428. For example, the edge control voltage 426 may have a curved shape that is convex downward between the edge start voltage 427 and the edge end voltage 428. Accordingly, the value obtained by subtracting the edge start voltage 427 from the edge end voltage 428 has a positive value. The angle of the straight line from the edge start voltage 427 to the edge end voltage 428 may have a second slope value $\beta_2$ that is a positive value.

A value obtained by subtracting the edge start voltage 427 from the edge end voltage 428 is greater than a value obtained by subtracting the center start voltage 422 from the center end voltage 423. Additionally, the positive second slope value $\beta_2$ is greater than the first slope value of 0°. For example, the straight line from the edge start voltage 427 to the edge end voltage 428 may be a shape rotated at an angle of less than 90° counterclockwise with respect to the straight line from the center start voltage 422 to the center end voltage 423.

The output voltage Vout2*b* of the center edge power supply unit 27 may be the edge reference voltage before the start point of the control period. The output voltage Vout2*b* of the edge power supply unit 28 may be the edge reference voltage after the end point of the control period. For example, the output voltage Vout2*b* of the edge power supply unit 28 may be a reference period in a remaining period other than the control period of the one cycle. The output voltage Vout2*b* of the edge power supply unit 28 may have the edge reference voltage in the reference period. The edge reference voltage may be greater than the edge control voltage 426. An absolute value of the edge reference voltage may be smaller than an absolute value of the edge control voltage 426. The edge reference voltage may be 0V.

Figure 5:
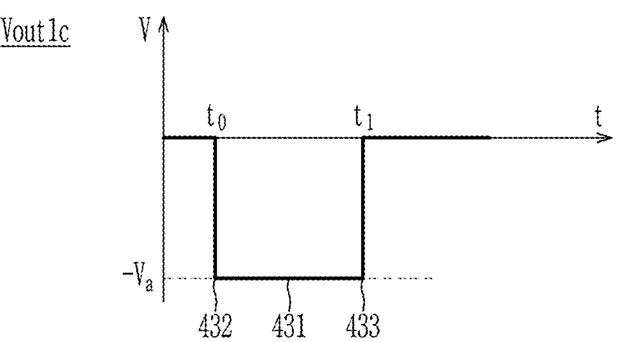
Figure 5:
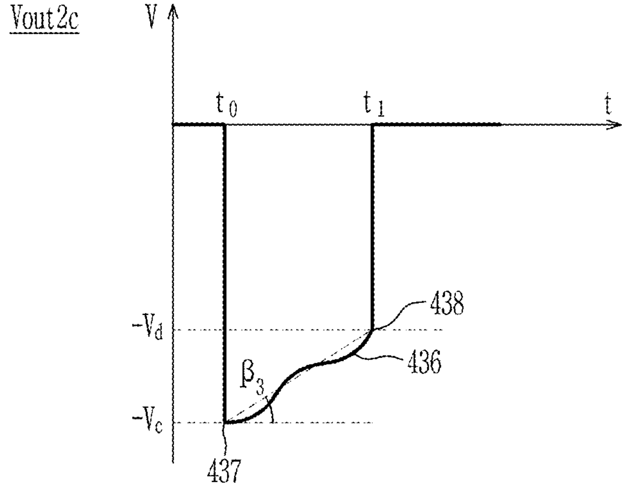

FIG. 5 is a drawing illustrating the waveform of the output voltage according to another embodiment of the bias power supply unit 26.

FIG. 5 illustrates a part of one cycle of the output voltage Vout1*c* of the center power supply unit 27 and the output voltage Vout2*c* of the edge power supply unit 28.

Referring to FIG. 5, the waveform of the output voltage Vout1*c* of the center power supply unit 27 may be a non-sinusoidal wave. The center power supply unit 27 may output the center control voltage 431 in a control period of one cycle. The center control voltage 431 may be a negative value. The control period may be positioned between the start point $t_0$ and the end point $t_1$. At the start point $t_0$ when the center control voltage 431 starts, the value of the center control voltage 431 may be the center start voltage 432. At the end point $t_1$ when the center control voltage 431 ends, the value of the center control voltage 431 may be the center end voltage 433. The magnitude −Va of the center start voltage 432 and the center end voltage 433 may be the same. Accordingly, a value obtained by subtracting the center start voltage 432 from the center end voltage 433 may be 0V. Additionally, the angle of a straight line from the center start voltage 432 to the center end voltage 433 may have a first slope value of 0°.

The output voltage Vout1*c* of the center power supply unit 27 may be the center reference voltage before the start point of the control period. The output voltage Vout1*c* of the center power supply unit 27 may be the center reference voltage after the end point of the control period. For example, the output voltage Vout1*c* of the center power supply unit 27 may be a reference period in a remaining period other than the control period of the one cycle. The output voltage Vout1*c* of the center power supply unit 27 may have the center reference voltage in the reference period. The center reference voltage may be greater than the center control voltage 431. An absolute value of the center reference voltage may be smaller than an absolute value of the center control voltage 431. The center reference voltage may be 0V. The output voltage Vout1*c* of the center power supply unit 27 may be a square wave that varies between 0V and the center control voltage 431.

The waveform of the output voltage Vout2*c* of the edge power supply unit 28 may be a non-sinusoidal wave. The edge power supply unit 28 may output the edge control voltage 436 in a control period of one cycle. The edge control voltage 436 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 436 starts, the value of the edge control voltage 436 may be the edge start voltage 437. The edge start voltage 437 is smaller than the center start voltage 432. For example, the absolute value Vc of the edge start voltage 437 is greater than the absolute value Va of the center start voltage 432. At the end point $t_1$ when the edge control voltage 436 ends, the value of the edge control voltage 436 may be the edge end voltage 438. The magnitude of the edge start voltage 437 and the edge end voltage 438 may be different. The magnitude of the edge start voltage 437 −Vc is smaller than the magnitude of the edge end voltage 438 −Vd. For example, the absolute value Vc of the edge start voltage 437 is greater than the absolute value Vd of the edge end voltage 438. The edge control voltage 436 may have a curved shape in at least a part between the edge start voltage 437 and the edge end voltage 438. The edge control voltage 436 may have at least one inflection point between the edge start voltage 437 and the edge end voltage 438. Accordingly, the value obtained by subtracting the edge start voltage 437 from the edge end voltage 438 has a positive value. The angle of the straight line from the edge start voltage 437 to the edge end voltage 438 may have a second slope value $\beta_3$ that is a positive value.

A value obtained by subtracting the edge start voltage 437 from the edge end voltage 438 is greater than a value subtracting the center start voltage 432 from the center end voltage 433. Additionally, the positive second slope value $\beta_3$ is greater than the first slope value of 0°. For example, the straight line from the edge start voltage 437 to the edge end voltage 438 may be a shape rotated at an angle of less than 90° counterclockwise with respect to the straight line from the center start voltage 432 to the center end voltage 433.

The output voltage Vout2*c* of the center edge power supply unit 27 may be the edge reference voltage before the start point of the control period. The output voltage Vout2*c* of the edge power supply unit 28 may be the edge reference voltage after the end point of the control period. For example, the output voltage Vout2*c* of the edge power supply unit 28 may be a reference period in a remaining period other than the control period of the one cycle. The output voltage Vout2*c* of the edge power supply unit 28 may have the edge reference voltage in the reference period. The edge reference voltage may be greater than the edge control voltage 436. An absolute value of the edge reference voltage may be smaller than an absolute value of the edge control voltage 436. The edge reference voltage may be 0V.

Figure 6:
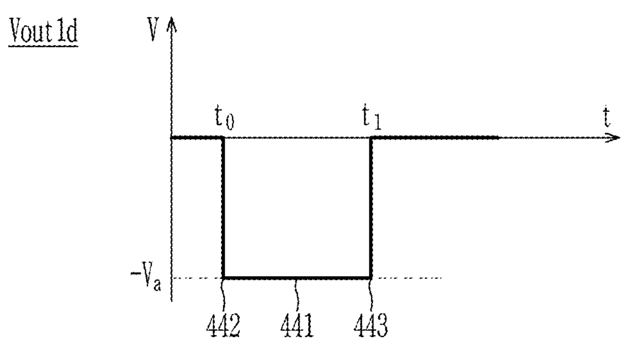
Figure 6:
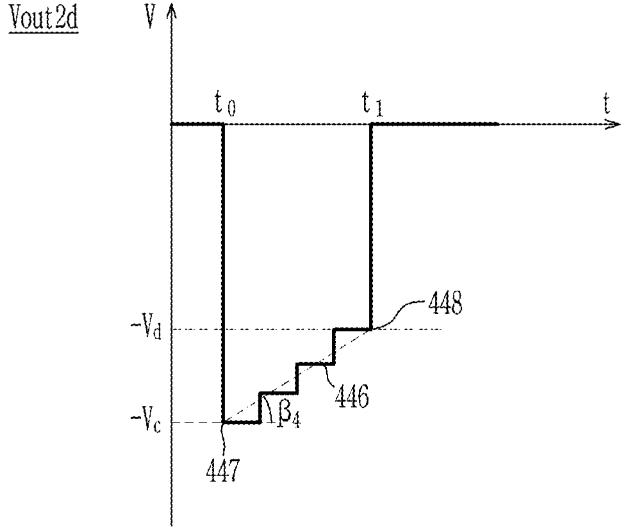

FIG. 6 is a drawing illustrating the waveform of the output voltage according to another embodiment of the bias power supply unit 26.

FIG. 6 illustrates a part of one cycle of the output voltage Vout1*d* of the center power supply unit 27 and the output voltage Vout2*d* of the edge power supply unit 28.

Referring to FIG. 6, the waveform of the output voltage Vout1*d* of the center power supply unit 27 may be a non-sinusoidal wave. The center power supply unit 27 may output the center control voltage 441 in a control period of one cycle. The center control voltage 441 may be a negative value. The control period may be positioned between the start point $t_0$ and the end point $t_1$. At the start point $t_0$ when the center control voltage 441 starts, the value of the center control voltage 441 may be the center start voltage 442. At the end point $t_1$ when the center control voltage 441 ends, the value of the center control voltage 441 may be the center end voltage 443. The magnitude of the center start voltage 442 and the center end voltage 443 may be the same. Accordingly, a value subtracting the center start voltage 442 from the center end voltage 443 may be 0V. Additionally, the angle of a straight line from the center start voltage 442 to the center end voltage 443 may have a first slope value of 0°.

The output voltage Vout1*d* of the center power supply unit 27 may be the center reference voltage before the start point of the control period. The output voltage Vout1*d* of the center power supply unit 27 may be the center reference voltage after the end point of the control period. For example, the output voltage Vout1*d* of the center power supply unit 27 may be a reference period in a remaining period other than the control period of the one cycle. The output voltage Vout1*d* of the center power supply unit 27 may have the center reference voltage in the reference period. The center reference voltage may be greater than the center control voltage 441. An absolute value of the center reference voltage may be smaller than an absolute value of the center control voltage 441. The center reference voltage may be 0V. The output voltage Vout1*d* of the center power supply unit 27 may be a square wave that varies between 0V and the center control voltage 441.

The waveform of the output voltage Vout2*d* of the edge power supply unit 28 may be a non-sinusoidal wave. The edge power supply unit 28 may output the edge control voltage 446 in a control period of one cycle. The edge control voltage 446 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 446 starts, the value of the edge control voltage 446 may be the edge start voltage 447. The edge start voltage 447 is smaller than the center start voltage 442. For example, the absolute value Vc of the edge start voltage 447 is greater than the absolute value Va of the center start voltage 442. At the end point $t_1$ when the edge control voltage 446 ends, the value of the edge control voltage 446 may be the edge end voltage 448. The magnitude of the edge start voltage 447 and the edge end voltage 448 may be different. The magnitude of the edge start voltage 447 −Vc is smaller than the magnitude of the edge end voltage 448 −Vd. For example, an absolute value Vc of the edge start voltage 447 is greater than an absolute value Vd the edge end voltage 448. The edge control voltage 446 may have a step wave shape between the edge start voltage 447 and the edge end voltage 448. Accordingly, the value subtracting the edge start voltage 447 from the edge end voltage 448 has a positive value. The angle of the straight line from the edge start voltage 447 to the edge end voltage 448 may have a second slope value $\beta_4$ that is a positive value.

A value subtracting the edge start voltage 447 from the edge end voltage 448 is greater than a value subtracting the center start voltage 442 from the center end voltage 443. Additionally, the positive second slope value $\beta_4$ is greater than the first slope value of 0°. For example, the straight line from the edge start voltage 447 to the edge end voltage 448 may be a shape rotated at an angle of less than 90° counterclockwise with respect to the straight line from the center start voltage 442 to the center end voltage 443.

The output voltage Vout2*d* of the center edge power supply unit 27 may be the edge reference voltage before the start point of the control period. The output voltage Vout2*d* of the edge power supply unit 28 may be the edge reference voltage after the end point of the control period. For example, the output voltage Vout2*d* of the edge power supply unit 28 may be a reference period in a remaining period other than the control period of the one cycle. The output voltage Vout2*d* of the edge power supply unit 28 may have the edge reference voltage in the reference period. The edge reference voltage may be greater than the edge control voltage 446. An absolute value of the edge reference voltage may be smaller than an absolute value of the edge control voltage 446. The edge reference voltage may be 0V.

Figure 7:
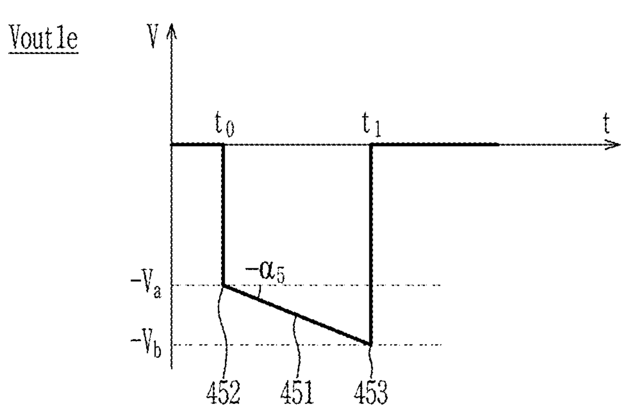
Figure 7:
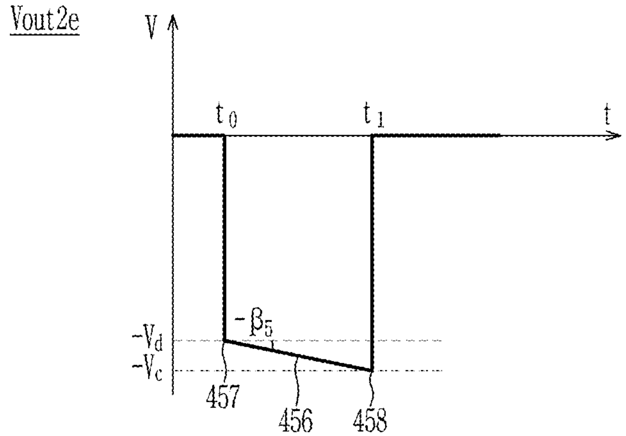

FIG. 7 is a drawing illustrating the waveform of the output voltage according to another embodiment of the bias power supply unit 26.

FIG. 7 illustrates a part of one cycle of the output voltage Vout1*e* of the center power supply unit 27 and the output voltage Vout2*e* of the edge power supply unit 28.

Referring to FIG. 7, the waveform of the output voltage Vout1*e* of the center power supply unit 27 may be a non-sinusoidal wave. The center power supply unit 27 may output the center control voltage 451 in a control period of one cycle. The center control voltage 451 may be a negative value. The control period may be positioned between the start point $t_0$ and the end point $t_1$ At the start point $t_0$ when the center control voltage 451 starts, the value of the center control voltage 451 may be the center start voltage 452. At the end point $t_1$ when the center control voltage 451 ends, the value of the center control voltage 451 may be the center end voltage 453.

The magnitude of the center start voltage 452 and the center end voltage 453 may be different. The magnitude −Va of the center start voltage 452 may be greater than the magnitude −Vb of the center end voltage 453. For example, an absolute value Va of the center start voltage 452 is smaller than an absolute value Vb of the center end voltage 453. Accordingly, a value obtained by subtracting the center start voltage 452 from the center end voltage 453 may be a negative value. Additionally, the angle of a straight line from the center start voltage 452 to the center end voltage 453 may have a first slope value $-\alpha_5$ that is a negative value.

The center control voltage 451 may have a slope shape that a portion of between the center start voltage 452 and the center end voltage 453 shape has a slope, similar to the edge control voltage 406 described above in FIG. 2. Also, the center control voltage 451 may have a curved shape that is convex upward in at least a part between the center start voltage 452 and the center end voltage 453, similar to the edge control voltage 416 described above in FIG. 3. In addition, the center control voltage 451 may have a curved shape that is convex downward in a part between the center start voltage 452 and the center end voltage 453, similar to the edge control voltage 426 described above in FIG. 4. Also, the center control voltage 451 may have at least one inflection point between the center start voltage 452 and the center end voltage 453, similar to the edge control voltage 436 described above in FIG. 5. Also, the center control voltage 451 may have a step wave shape between the center start voltage 452 and the center end voltage 453, similar to the edge control voltage 446 described above in FIG. 6.

The output voltage Vout1*e* of the center power supply unit 27 may be the center reference voltage before the start point of the control period. The output voltage Vout1*e* of the center power supply unit 27 may be the center reference voltage after the end point of the control period. For example, the output voltage Vout1*e* of the center power supply unit 27 may be a reference period in a remaining period other than the control period of the one cycle. The output voltage Vout1*e* of the center power supply unit 27 may have the center reference voltage in the reference period. The center reference voltage may be greater than the center control voltage 451. An absolute value of the center reference voltage may be smaller than an absolute value of the center control voltage 451. The center reference voltage may be 0V.

The waveform of the output voltage Vout2*e* of the edge power supply unit 28 may be a non-sinusoidal wave. The edge power supply unit 28 may output the edge control voltage 456 in a control period of one cycle. The edge control voltage 456 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 456 starts, the value of the edge control voltage 456 may be the edge start voltage 457. The edge start voltage 457 is smaller than the center start voltage 452. For example, the absolute value Vd of the edge start voltage 457 is greater than the absolute value Va of the center start voltage 452. An absolute value Vd of the edge start voltage 457 may be greater than an absolute value Vb of the center end voltage 453. At the end point $t_1$ when the edge control voltage 456 ends, the value of the edge control voltage 456 may be the edge end voltage 458. The magnitude of the edge start voltage 457 and the edge end voltage 458 may be different. The magnitude −Vd of the edge start voltage 457 is greater than the magnitude −Vc of the edge end voltage 458. For example, the absolute value Vd of the edge start voltage 457 is smaller than the absolute value Vc of the edge end voltage 458. Accordingly, the value subtracting the edge start voltage 457 from the edge end voltage 458 has a negative value. The angle of the straight line from the edge start voltage 457 to the edge end voltage 458 may have a second slope value $\beta_5$ that is a negative value.

The deviation between the edge start voltage 457 and the edge end voltage 458 is less than the deviation between the center start voltage 452 and the center end voltage 453. Accordingly, a value obtained by subtracting the edge start voltage 457 from the edge end voltage 458 is greater than a value subtracting the center start voltage 452 from the center end voltage 453. For example, an absolute value of the value obtained by subtracting the edge start voltage 457 from the edge end voltage 458 is greater than an absolute value of the value obtained by subtracting the center start voltage 452 from the center end voltage 453. Additionally, the second slope value $-\beta_5$ is greater than the first slope value $-\alpha_5$. For example, the straight line from the edge start voltage 457 to the edge end voltage 458 may be a shape rotated at an angle of less than 90° counterclockwise with respect to the straight line from the center start voltage 452 to the center end voltage 453.

The edge control voltage 456 may have a slope shape a portion between the edge start voltage 457 and the edge end voltage 458 has a slope, similar to the edge control voltage

406 described above in FIG. 2. Also, the edge control voltage 456 may have a curved shape that is convex upward in at least a part between the edge start voltage 457 and the edge end voltage 458, similar to the edge control voltage 416 described above in FIG. 3. In addition, the edge control voltage 456 may have a curved shape that is convex downward in at least a part between the edge start voltage 457 and the edge end voltage 458, similar to the edge control voltage 426 described above in FIG. 4. Also, the edge control voltage 456 may have at least one inflection point between the edge start voltage 457 and the edge end voltage 458, similar to the edge control voltage 436 described above in FIG. 4. Also, the edge control voltage 456 may have a step wave shape between the edge start voltage 457 and the edge end voltage 458, similar to the edge control voltage 446 described above in FIG. 6.

The output voltage Vout2*e* of the center edge power supply unit 27 may be the edge reference voltage before the start point of the control period. The output voltage Vout2*e* of the edge power supply unit 28 may be the edge reference voltage after the end point of the control period. For example, the output voltage Vout2*e* of the edge power supply unit 28 may be a reference period in a remaining period other than the control period of the one cycle. The output voltage Vout2*e* of the edge power supply unit 28 may have the edge reference voltage in the reference period. The edge reference voltage may be greater than the edge control voltage 456. An absolute value of the edge reference voltage may be smaller than an absolute value of the edge control voltage 456. The edge reference voltage may be 0V.

Figure 8:
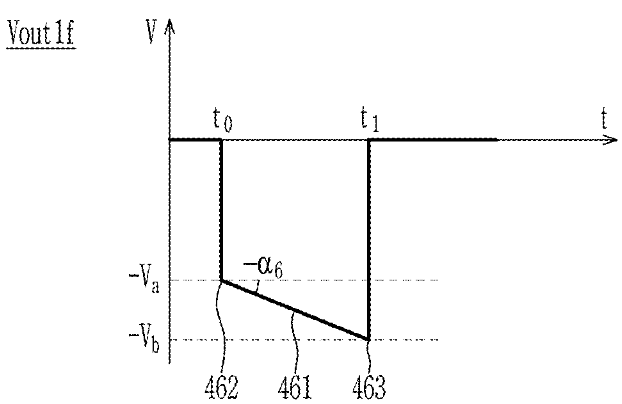
Figure 8:
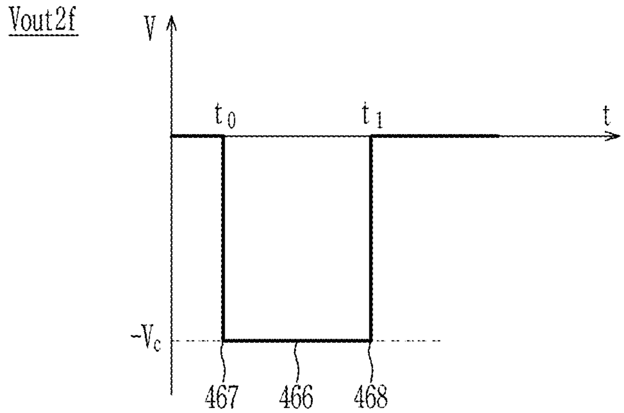

FIG. 8 is a drawing illustrating the waveform of the output voltage according to another embodiment of the bias power supply unit 26.

FIG. 8 illustrates a part of one cycle of the output voltage Vout1*f* of the center power supply unit 27 and the output voltage Vout2*f* of the edge power supply unit 28.

Referring to FIG. 8, the waveform of the output voltage Vout1*f* of the center power supply unit 27 may be a non-sinusoidal wave. The center power supply unit 27 may output the center control voltage 461 in a control period of one cycle. The center control voltage 461 may be a negative value. The control period may be positioned between the start point $t_0$ and the end point $t_1$. At the start point to when the center control voltage 401 starts, the value of the center control voltage 461 may be the center start voltage 462. At the end point $t_1$ when the center control voltage 461 ends, the value of the center control voltage 461 may be the center end voltage 463.

The magnitude of the center start voltage 462 and the center end voltage 463 may be different. The magnitude −Va of the center start voltage 462 may be greater than the magnitude −Vb of the center end voltage 463. For example, an absolute value Va of the center start voltage 462 is smaller than an absolute value Vb of the center end voltage 468. Accordingly, a value obtained by subtracting the center start voltage 462 from the center end voltage 463 may be a negative value. Additionally, the angle of a straight line from the center start voltage 462 to the center end voltage 463 may have a first slope value $-\alpha_6$ that is a negative value.

The center control voltage 461 may have a slope shape that a portion between the center start voltage 462 and the center end voltage 463 has a slope, similar to the edge control voltage 406 described above in FIG. 2. Also, the center control voltage 461 may have a curved shape that is convex upward in at least a part between the center start voltage 462 and the center end voltage 463, similar to the edge control voltage 416 described above in FIG. 3. In addition, the center control voltage 461 may have a curved shape that is convex downward in at least a part between the center start voltage 452 and the center end voltage 463, similar to the edge control voltage 466 described above in FIG. 4. Also, the center control voltage 461 may have at least one inflection point between the center start voltage 462 and the center end voltage 463, similar to the edge control voltage 466 described above in FIG. 5. Also, the center control voltage 461 may have a step wave shape between the center start voltage 462 and the center end voltage 463, similar to the edge control voltage 466 described above in FIG. 6.

The output voltage Vout1*f* of the center power supply unit 27 may be the center reference voltage before the start point of the control period. The output voltage Vout1*f* of the center power supply unit 27 may be the center reference voltage after the end point of the control period. For example, the output voltage Vout1*f* of the center power supply unit 27 may be a reference period in a remaining period other than the control period of the one cycle. The output voltage Vout1*f* of the center power supply unit 27 may have the center reference voltage in the reference period. The center reference voltage may be greater than the center control voltage 461. An absolute value of the center reference voltage may be smaller than an absolute value of the center control voltage 461. The center reference voltage may be 0V.

The waveform of the output voltage Vout2*f* of the edge power supply unit 28 may be a non-sinusoidal wave. The edge power supply unit 28 may output the edge control voltage 466 in a control period of one cycle. The edge control voltage 466 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 466 starts, the value of the edge control voltage 466 may be the edge start voltage 467. The edge start voltage 467 is smaller than the center start voltage 462. For example, the absolute value Vc of the edge start voltage 467 is greater than the absolute value Va of the center start voltage 462. An absolute value Vc of the edge start voltage 467 is greater than an absolute value Vb of center end voltage 463. At the end point $t_1$ when the edge control voltage 466 ends, the value of the edge control voltage 466 may be the edge end voltage 458. The magnitude of the edge start voltage 467 and the edge end voltage 458 may be same. Accordingly, a value subtracting the edge start voltage 467 from the edge end voltage 458 may be 0V. Additionally, the angle of the straight line from the edge start voltage 467 to the edge end voltage 458 may have a second slope value of 0°. Accordingly, a value subtracting the edge start voltage 467 from the edge end voltage 468 is greater than a value subtracting the center start voltage 462 from the center end voltage 463. An absolute value of the value subtracting the edge start voltage 467 from the edge end voltage 468 is smaller than an absolute value of the value subtracting the center start voltage 462 from the center end voltage 463. Additionally, the second slope value of 0° is greater than the first slope value $-\alpha_6$ that is a negative value. For example, the straight line from the edge start voltage 467 to the edge end voltage 468 may be a shape rotated at an angle of less than 90° counterclockwise with respect to the straight line from the center start voltage 462 to the center end voltage 463.

The output voltage Vout2*f* of the center edge power supply unit 27 may be the edge reference voltage before the start point of the control period. The output voltage Vout2*f* of the edge power supply unit 28 may be the edge reference voltage after the end point of the control period. For example, the output voltage Vout2*f* of the edge power supply unit 28 may be a reference period in a remaining period other than the control period of the one cycle. The output voltage Vout2*f* of the edge power supply unit 28 may have the edge reference voltage in the reference period. The edge reference voltage may be greater than the edge control voltage 466. An absolute value of the edge reference voltage may be smaller than an absolute value of the edge control voltage 466. The edge reference voltage may be 0V.

Figure 9:
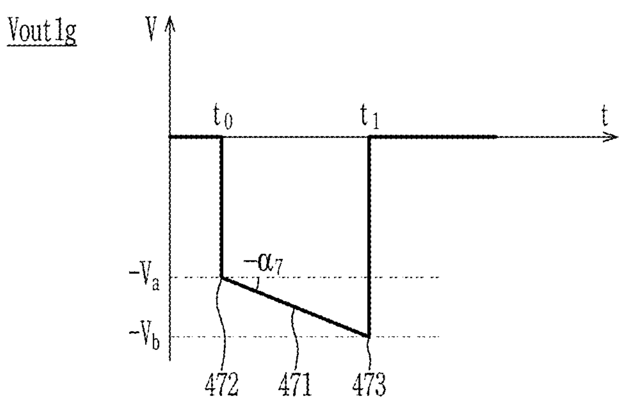
Figure 9:
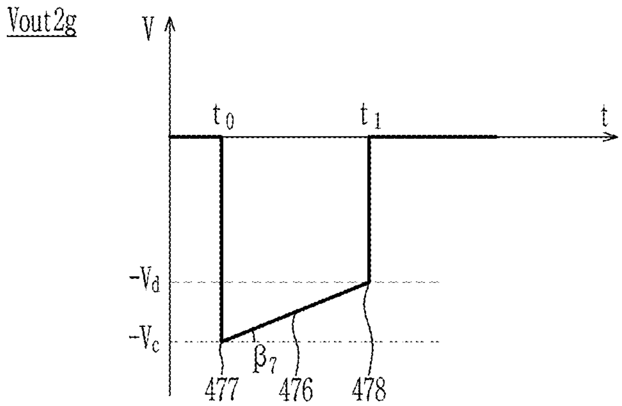

FIG. 9 is a drawing illustrating the waveform of the output voltage according to another embodiment of the bias power supply unit 26.

FIG. 9 illustrates a part of one cycle of the output voltage Vout1*g* of the center power supply unit 27 and the output voltage Vout2*g* of the edge power supply unit 28.

Referring to FIG. 9, the waveform of the output voltage Vout1*g* of the center power supply unit 27 may be a non-sinusoidal wave. The center power supply unit 27 may output the center control voltage 471 in a control period of one cycle. The center control voltage 471 may be a negative value. The control period may be positioned between the start point $t_0$ and the end point $t_1$. At the start point to when the center control voltage 471 starts, the value of the center control voltage 471 may be the center start voltage 472. At the end point $t_1$ when the center control voltage 471 ends, the value of the center control voltage 471 may be the center end voltage 473.

The magnitude of the center start voltage 472 and the center end voltage 473 may be different. The magnitude −Va of the center start voltage 472 may be greater than the magnitude −Vb of the center end voltage 473. For example, an absolute value Va of the center start voltage 472 is smaller than an absolute value Vb of the center end voltage 478. Accordingly, a value obtained by subtracting the center start voltage 472 from the center end voltage 473 may be a negative value. Additionally, the angle of a straight line from the center start voltage 472 to the center end voltage 473 may have a first slope value $-\alpha_7$ that is a negative value.

The center control voltage 471 may have a slope shape that a portion between the center start voltage 472 and the center end voltage 473 has a slope, similar to the edge control voltage 406 described above in FIG. 2. In addition, the center control voltage 471 may have a curved shape that is convex upward in at least a part between the center start voltage 472 and the center end voltage 473, similar to the edge control voltage 476 described above in FIG. 3. In addition, the center control voltage 471 may have a curved shape that is convex downward in at least a part between the center start voltage 472 and the center end voltage 473, similar to the edge control voltage 476 described above in FIG. 4. Also, the center control voltage 471 may have at least one inflection point between the center start voltage 472 and the center end voltage 473, similar to the edge control voltage 466 described above in FIG. 5. Also, the center control voltage 471 may have a step wave shape between the center start voltage 472 and the center end voltage 473, similar to the edge control voltage 446 described above in FIG. 6.

The output voltage Vout1*g* of the center power supply unit 27 may be the center reference voltage before the start point of the control period. The output voltage Vout1*g* of the center power supply unit 27 may be the center reference voltage after the end point of the control period. For example, the output voltage Vout1*g* of the center power supply unit 27 may be a reference period in a remaining period other than the control period of the one cycle. The output voltage Vout1*g* of the center power supply unit 27 may have the center reference voltage in the reference period. The center reference voltage may be greater than the center control voltage 471. An absolute value of the center reference voltage may be smaller than an absolute value of the center control voltage 471. The center reference voltage may be 0V.

The waveform of the output voltage Vout2*g* of the edge power supply unit 28 may be a non-sinusoidal wave. The edge power supply unit 28 may output the edge control voltage 476 in a control period of one cycle. The edge control voltage 476 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 476 starts, the value of the edge control voltage 476 may be the edge start voltage 477. The edge start voltage 477 is smaller than the center start voltage 472. For example, the absolute value Vc of the edge start voltage 477 is greater than the absolute value Va of the center start voltage 472. An absolute value Vc of the edge start voltage 477 may be greater than an absolute value Vb of center end voltage 473. At the end point $t_1$ when the edge control voltage 476 ends, the value of the edge control voltage 476 may be the edge end voltage 478. The magnitude of the edge start voltage 477 and the edge end voltage 478 may be different. The magnitude −Vc of the edge start voltage 477 is smaller than the magnitude −Vd of the edge end voltage 478. That is, the absolute value Vc of the edge start voltage 477 is greater than the absolute value Vd of the edge end voltage 478. Accordingly, the value obtained by subtracting the edge start voltage 477 from the edge end voltage 478 has a positive value. The angle of the straight line from the edge start voltage 477 to the edge end voltage 478 may have a second slope value $\beta_7$ that is a positive value.

A value obtained by subtracting the edge start voltage 477 from the edge end voltage 478 is a positive value and greater than a negative value of subtracting the center start voltage 472 from the center end voltage 473. Additionally, a second slope value $\beta_7$, which is a positive value, is greater than the first slope value $-\alpha_7$, which is a negative value. For example, the straight line from the edge start voltage 477 to the edge end voltage 478 may be a shape rotated at an angle of less than 90° counterclockwise with respect to the straight line from the center start voltage 472 to the center end voltage 473.

The edge control voltage 476 may have a slope shape that a portion between the edge start voltage 477 and the edge end voltage 478 has a slope, similar to the edge control voltage 406 described above in FIG. 2. Also, the edge control voltage 476 may have a curved shape that is convex upward in at least a part between the edge start voltage 477 and the edge end voltage 478, similar to the edge control voltage 416 described above in FIG. 3. In addition, the edge control voltage 476 may have a curved shape that is convex downward in at least a part between the edge start voltage 477 and the edge end voltage 478, similar to the edge control voltage 426 described above in FIG. 4. Also, the edge control voltage 476 may have at least one inflection point between the edge start voltage 477 and the edge end voltage 478, similar to the edge control voltage 436 described above in FIG. 5. Also, the edge control voltage 476 may have a step wave shape between the edge start voltage 477 and the edge end voltage 478, similar to the edge control voltage 446 described above in FIG. 6.

The output voltage Vout2*g* of the center edge power supply unit 27 may be the edge reference voltage before the start point of the control period. The output voltage Vout2*g* of the edge power supply unit 28 may be the edge reference voltage after the end point of the control period. For example, the output voltage Vout2*g* of the edge power supply unit 28 may be a reference period in a remaining period other than the control period of the one cycle. The output voltage Vout2*g* of the edge power supply unit 28 may have the edge reference voltage in the reference period. The edge reference voltage may be greater than the edge control voltage 476. An absolute value of the edge reference voltage may be smaller than an absolute value of the edge control voltage 476. The edge reference voltage may be 0V.

Figure 10:
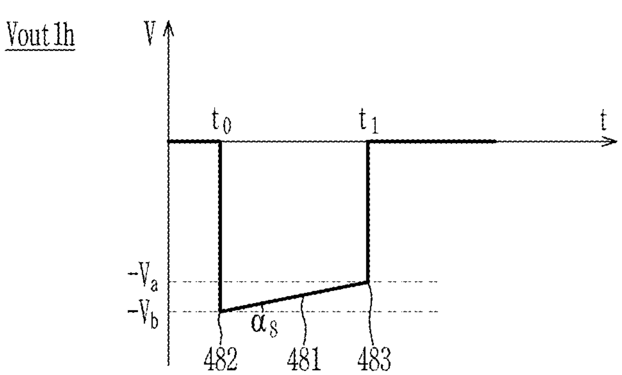
Figure 10:
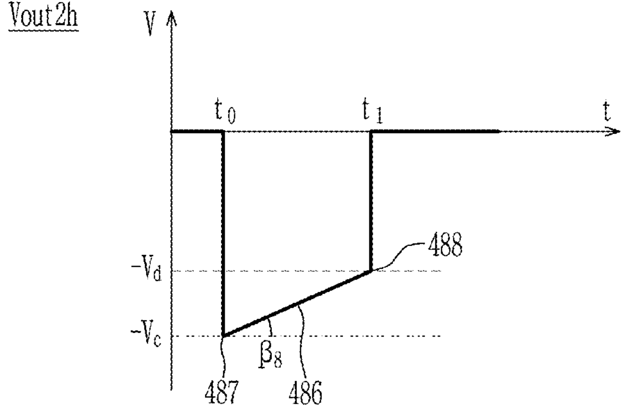

FIG. 10 is a drawing illustrating the waveform of the output voltage according to another embodiment of the bias power supply unit 26.

FIG. 10 illustrates a part of one cycle of the output voltage Vout1*h* of the center power supply unit 27 and the output voltage Vout2*h* of the edge power supply unit 28.

Referring to FIG. 10, the waveform of the output voltage Vout1*h* of the center power supply unit 27 may be a non-sinusoidal wave. The center power supply unit 27 may output the center control voltage 481 in a control period of one cycle. The control period may be positioned between the start point $t_0$ and the end point $t_1$. At the start point $t_0$ when the center control voltage 481 starts, the value of the center control voltage 481 may be the center start voltage 482. At the end point $t_1$ when the center control voltage 481 ends, the value of the center control voltage 481 may be the center end voltage 483. At the end point $t_1$ when the center control voltage 481 ends, the value of the center control voltage 481 may be the center end voltage 483.

The magnitude of the center start voltage 482 and the center end voltage 483 may be different. The magnitude −Va of the center start voltage 482 may be smaller than the magnitude −Vb of the center end voltage 483. For example, an absolute value Va of the center start voltage 482 is greater than an absolute value Vb of the center end voltage 483. Accordingly, a value obtained by subtracting the center start voltage 482 from the center end voltage 853 may be a positive value. Additionally, the angle of a straight line from the center start voltage 482 to the center end voltage 483 may have a first slope value as that is a positive value.

The center control voltage 481 may have a slope shape that a portion between the center start voltage 482 and the center end voltage 483 has a slope, similar to the edge control voltage 406 described above in FIG. 2. Also, the center control voltage 481 may have a curved shape that is convex upward in at least a part between the center start voltage 482 and the center end voltage 483, similar to the edge control voltage 416 described above in FIG. 3. In addition, the center control voltage 481 may have a curved shape that is convex downward in at least a part between the center start voltage 482 and the center end voltage 483, similar to the edge control voltage 426 described above in FIG. 4. Also, the center control voltage 481 may have at least one inflection point between the center start voltage 482 and the center end voltage 483, similar to the edge control voltage 466 described above in FIG. 5. Also, the center control voltage 481 may have a step wave shape between the center start voltage 482 and the center end voltage 483, similar to the edge control voltage 446 described above in FIG. 6.

The output voltage Vout1*h* of the center power supply unit 27 may be the center reference voltage before the start point of the control period. The output voltage Vout1*h* of the center power supply unit 27 may be the center reference voltage after the end point of the control period. For example, the output voltage Vout1*h* of the center power supply unit 27 may be a reference period in a remaining period other than the control period of the one cycle. The output voltage Vout1*h* of the center power supply unit 27 may have the center reference voltage in the reference period. The center reference voltage may be greater than the center control voltage 481. An absolute value of the center reference voltage may be smaller than an absolute value of the center control voltage 481. The center reference voltage may be 0V.

The waveform of the output voltage Vout2*h* of the edge power supply unit 28 may be a non-sinusoidal wave. The edge power supply unit 28 may output the edge control voltage 486 in a control period of one cycle. The edge control voltage 486 may be a negative value. The control period may be positioned between the start point $t_0$ and the end point $t_1$. The edge power supply unit 28 may be synchronized with the center power supply unit 27 to change the waveform of the output voltage. Accordingly, the start point $t_0$ of the edge power supply unit 28 is the same as the start point $t_0$ of the center power supply unit 27, and the end point $t_1$ of the edge power supply unit 28 is the same as the end point $t_1$ of the center power supply unit 27.

At the start point $t_0$ when the edge control voltage 486 starts, a value of the edge control voltage 486 may be the edge start voltage 487. The edge start voltage 487 is smaller than the center start voltage 482. That is, the absolute value Vc of the edge start voltage 487 is greater than the absolute value Vb of the center start voltage 482. At the end point $t_1$ when the edge control voltage 486 ends, the value of the edge control voltage 486 may be the edge end voltage 488. The magnitude of the edge start voltage 487 and the edge end voltage 488 may be different. The magnitude −Vc of the edge start voltage 487 is smaller than the magnitude −Vd of the edge end voltage 488. That is, the absolute value Vc of the edge start voltage 487 is greater than the absolute value Vd of the edge end voltage 488. Accordingly, the value subtracting the edge start voltage 487 from the edge end voltage 488 has a positive value. The angle of the straight line from the edge start voltage 487 to the edge end voltage 488 may have a second slope value $\beta_8$ that is a positive value.

The deviation between the edge start voltage 487 and the edge end voltage 488 is greater than the deviation between the center start voltage 482 and the center end voltage 418. Accordingly, a value obtained by subtracting the edge start voltage 487 from the edge end voltage 488 is greater than a value subtracting the center start voltage 482 from the center end voltage 483. Additionally, the second slope value $\beta_8$ is greater than the first slope value $\alpha_8$. For example, the straight line from the edge start voltage 487 to the edge end voltage 488 may be a shape rotated at an angle of less than 90° counterclockwise with respect to the straight line from the center start voltage 482 to the center end voltage 483.

The edge control voltage 486 may have a slope shape having a slope between the edge start voltage 487 and the edge end voltage 488, similar to the edge control voltage 486 described above in FIG. 2. Also, the edge control voltage 486 may have a curved shape that is convex upward in at least a part between the edge start voltage 487 and the edge end voltage 488, similar to the edge control voltage 416 described above in FIG. 3. In addition, the edge control voltage 486 may have a curved shape that is convex downward in at least a part between the edge start voltage 487 and the edge end voltage 488, similar to the edge control voltage 466 described above in FIG. 4. Also, the edge control voltage 486 may have at least one inflection point between the edge start voltage 487 and the edge end voltage 488, similar to the edge control voltage 436 described above in FIG. 4. Also, the edge control voltage 486 may have a step wave shape between the edge start voltage 487 and the edge end voltage 488, similar to the edge control voltage 446 described above in FIG. 6.

The output voltage Vout2*h* of the center edge power supply unit 27 may be the edge reference voltage before the start point of the control period. The output voltage Vout2*h* of the edge power supply unit 28 may be the edge reference voltage after the end point of the control period. For example, the output voltage Vout2*h* of the edge power supply unit 28 may be a reference period in a remaining period other than the control period of the one cycle. The output voltage Vout2*h* of the edge power supply unit 28 may have the edge reference voltage in the reference period. The edge reference voltage may be greater than the edge control voltage 486. An absolute value of the edge reference voltage may be smaller than an absolute value of the edge control voltage 486. The edge reference voltage may be 0V.

Figure 11:
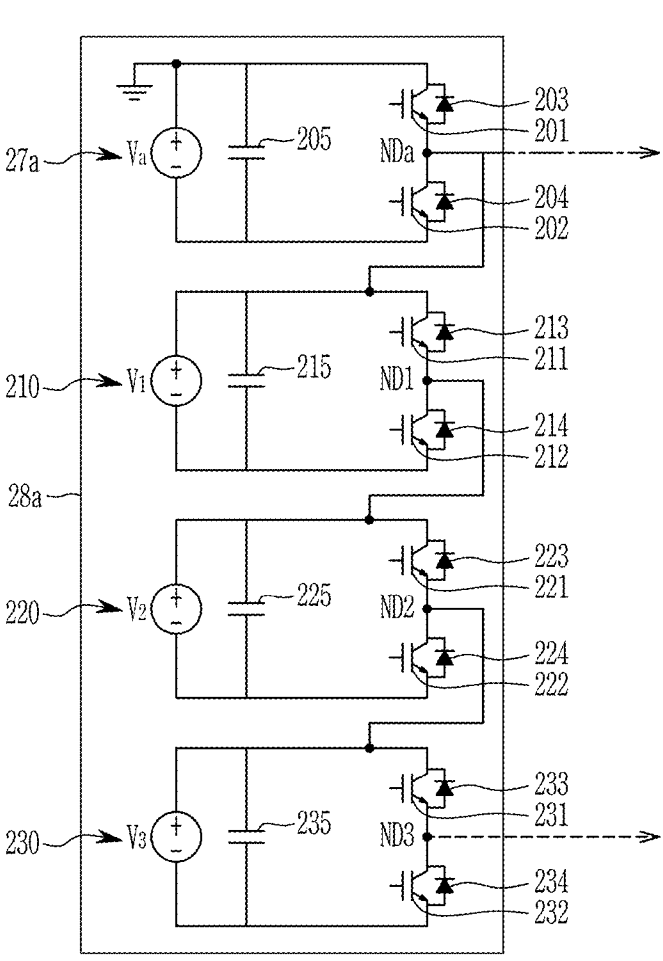
FIG. 11 is a circuit diagram of a bias power supply unit according to one or more embodiments.

FIG. 11 is a circuit diagram of a bias power supply unit 26*a* according to one or more embodiments.

Referring to FIG. 11, the bias power supply unit 26*a* includes a center power supply unit 27*a* and at least one pulse power module 210, 220, and 230.

The center power supply unit 27*a* generates a square wave. The center power supply unit 27*a* includes a center direct current power source Va, a center deactivation switch 201, and a center activation switch 202.

A positive terminal side of the center direct current power source Va is grounded. The center deactivation switch 201 is connected between the positive terminal of the center direct current power source Va and a center side node NDa. A center first freewheeling diode 203 may be connected in parallel to the center deactivation switch 201. The center activation switch 202 is connected between the minus terminal of the center direct current power source Va and the center side node NDa. A center second freewheeling diode 204 may be connected in parallel to the center activation switch 202. A center input capacitor 205 may be connected in parallel to the center direct current power source Va. The center side node NDa may be an output terminal of the center power supply unit 27*a*. The center power supply unit 27*a* is deactivated when the center deactivation switch 201 is turned on and the center activation switch 202 is turned off. The center power supply unit 27*a* is activated when the center activation switch 202 is turned on and the center deactivation switch 201 is turned off. When the center power supply unit 27*a* is deactivated, 0V is output. When the center power supply unit 27*a* is activated, a negative level voltage with a magnitude corresponding to the center direct current power source Va is output.

The pulse power modules 210, 220, and 230 generate square waves. The pulse power modules 210, 220, and 230 are connected to the center power supply unit 27*a* in a cascade structure. Additionally, when there are a plurality of pulse power modules 210, 220, and 230, each pulse power module 210, 220, and 230 are connected in a cascade structure. In FIG. 11, there are three pulse power modules 210, 220, and 230, and an example including a first pulse power module 210, a second pulse power module 220, and a third pulse power module 230 is illustrated.

The first pulse power module 210 includes a first edge direct current power source V1, a first deactivation switch 211, and a first activation switch 212.

The positive terminal of the first edge direct current power source V1 is connected to the center side node NDa. The first deactivation switch 211 is connected between the positive terminal of the first edge direct current power source V1 and a first edge node ND1. A first deactivation side freewheeling diode 213 may be connected in parallel to the first deactivation switch 211. The first activation switch 212 is connected between the minus terminal of the first edge direct current power source V1 and the first edge node ND1. A first activation side freewheeling diode 214 may be connected in parallel to the first activation switch 212. A first edge input capacitor 215 may be connected in parallel to the first edge direct current power source V1. The first edge node ND1 may be an output terminal of the first pulse power module 210. The first pulse power module 210 is deactivated when the first deactivation switch 211 is turned on and the first activation switch 212 is turned off. The first pulse power module 210 is activated when the first activation switch 212 is turned on and the first deactivation switch 211 is turned off. When the first pulse power module 210 is activated, the voltage of the center side node NDa is output. When the first pulse power module 210 is activated, a sum of a voltage of the center side node NDa and a voltage that has a magnitude corresponding to the first edge direct current power source V1 and is a negative level is output.

The second pulse power module 220 includes a second edge direct current power source V2, a second deactivation switch 221, and a second activation switch 222.

The positive terminal side of the second edge direct current power source V2 is connected to the first edge node ND1. The second deactivation switch 221 is connected between a positive terminal of the second edge direct current power source V2 and the second edge node ND2. A second deactivation side freewheeling diode 223 may be connected in parallel to the second deactivation switch 221. The second activation switch 222 is connected between the negative terminal of the second edge direct current power source V2 and the second edge node ND2. A second activation side freewheeling diode 224 may be connected in parallel to the second activation switch 222. A second edge input capacitor 225 may be connected in parallel to the second edge direct current power source V2. The second edge node ND2 may be an output terminal of the second pulse power module 220. The second pulse power module 220 is deactivated when the second deactivation switch 221 is turned on and the second activation switch 222 is turned off. The second pulse power module 220 is activated when the second activation switch 222 is turned on and the second deactivation switch 221 is turned off. When the second pulse power module 220 is deactivated, the voltage of the first edge node ND1 is output. When the second pulse power module 220 is activated, the sum of the voltage of the first edge node ND1 and a negative level voltage corresponding to the second edge direct current power source V2 is output.

The third pulse power module 230 includes a third edge direct current power source V3, a third deactivation switch 231, and a third activation switch 232.

The positive terminal side of the third edge direct current power source V3 is connected to the second edge node ND2. The third deactivation switch 231 is connected between the positive terminal of the third edge direct current power source V3 and a third edge node ND3. A third deactivation side freewheeling diode 233 may be connected in parallel to the third deactivation switch 231. The third activation switch 232 is connected between the negative terminal of the third edge direct current power source V3 and the third edge node (ND3). A third activation side freewheeling diode 234 may be connected in parallel to the third activation switch 232. A third edge input capacitor 235 may be connected in parallel to the third edge direct current power source V3. The third edge node ND3 may be an output terminal of the first pulse power module 230. The third pulse power module 230 is deactivated when the third deactivation switch 231 is turned on and the third activation switch 232 is turned off. The third pulse power module 230 is activated when the third activation switch 232 is turned on and the third deactivation switch 231 is turned off. When the third pulse power module 230 is deactivated, the voltage of the second edge node ND2 is output. When the third pulse power module 230 is activated, the sum of the voltage of the second edge node ND2 and a negative level voltage corresponding to the third edge direct current power source V3 is output.

Among the at least one pulse power module 210, 220, 230, the output terminal of the pulse power module 230 disposed last on the opposite side of the direction connected to the center power supply unit 27*a* becomes an output terminal of the edge power supply unit 28*a*. That is, the center power supply unit 27*a* and at least one of the pulse power modules 210, 220, and 230 connected to the center power supply unit 27*a* in a cascade structure become the edge power supply unit 28*a*.

The center deactivation switch 201, the center activation switches 202, the deactivation switches 211, 221, and 231, and the activation switches 212, 222, and 232 described above may be power semiconductor devices. For example, the center deactivation switch 201, the center activation switch 202, the deactivation switches 211, 221, 231, and the activation switches 212, 222, and 232 may be insulated gate bipolar transistor (IGBT), power MOSFET, etc. In addition, the power semiconductor device is controlled by a gate driver and may operate at a speed of several nanoseconds (nsec) to hundreds of nsec.

FIG. 12 to FIG. 17 are drawings showing the operating state of the bias power supply unit 26*a* of FIG. 11.

Figure 12:
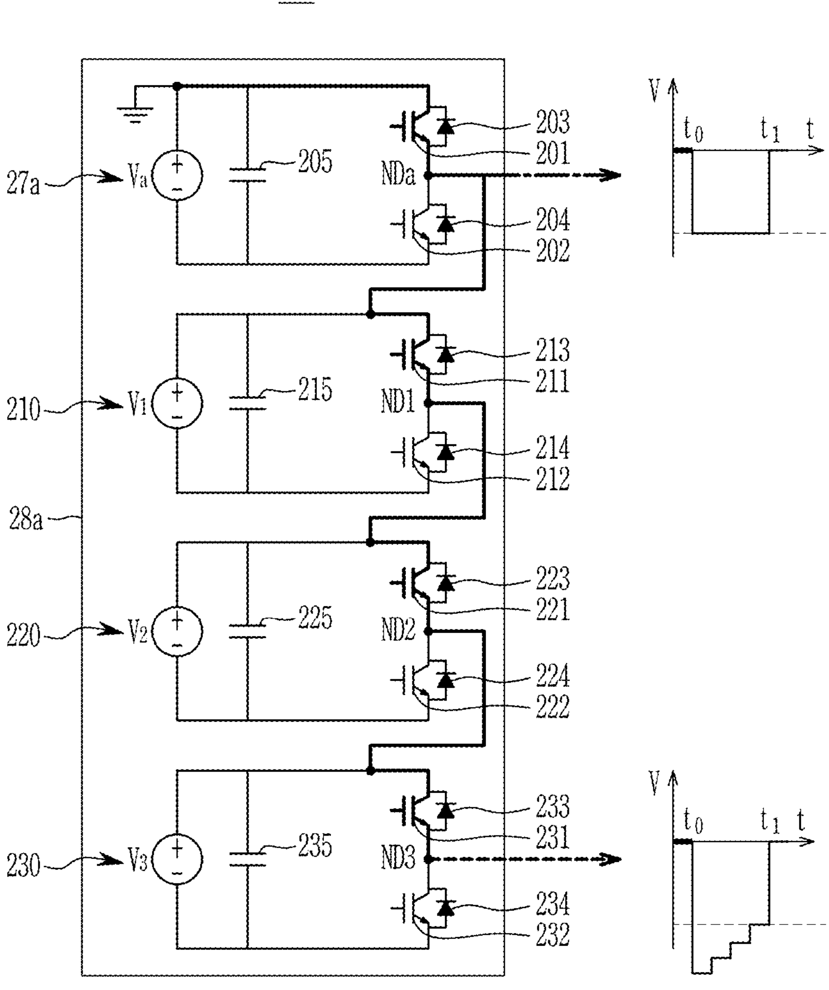
FIGS. 12, 13, 14, 15, 16, and 17 illustrate the operating state of the bias power supply unit of FIG. 11.

Referring to FIG. 12, during the reference period, all of the center power supply unit 27*a* and the pulse power modules 210, 220, and 230 are deactivated. Accordingly, 0V is output to the output terminal of the center power supply unit 27*a*, and 0V is output to the output terminal of the edge power supply unit 28*a*.

Figure 13:
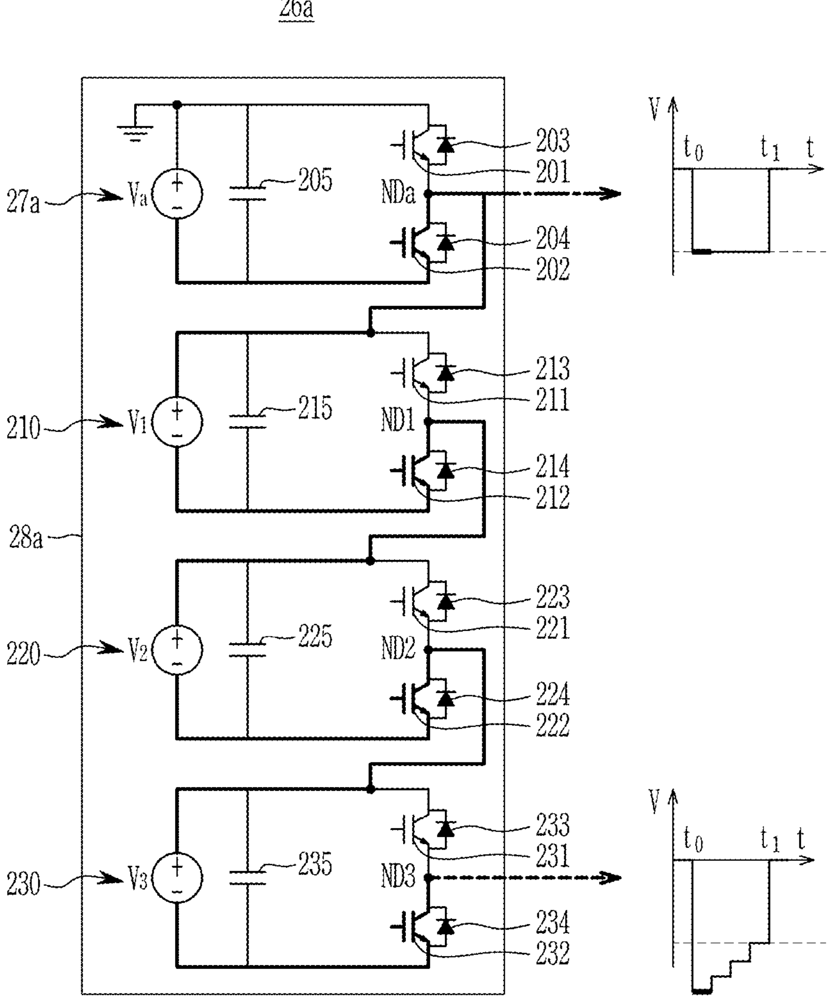

Referring to FIG. 13, when the control period starts (that is, at the start point t0), all of the center power supply unit 27*a* and the pulse power modules 210, 220, and 230 are activated. Accordingly, a negative level voltage with a magnitude corresponding to the center direct current power source Va is output to the output terminal of the center power supply unit 27*a*. Also, a negative level voltage corresponding to the sum of the center direct current power source Va, the first edge direct current power source V1, the second edge direct current power source V2, and the third edge direct current power source V3 is output to the output terminal of the edge power supply unit 28*a*.

Figure 14:
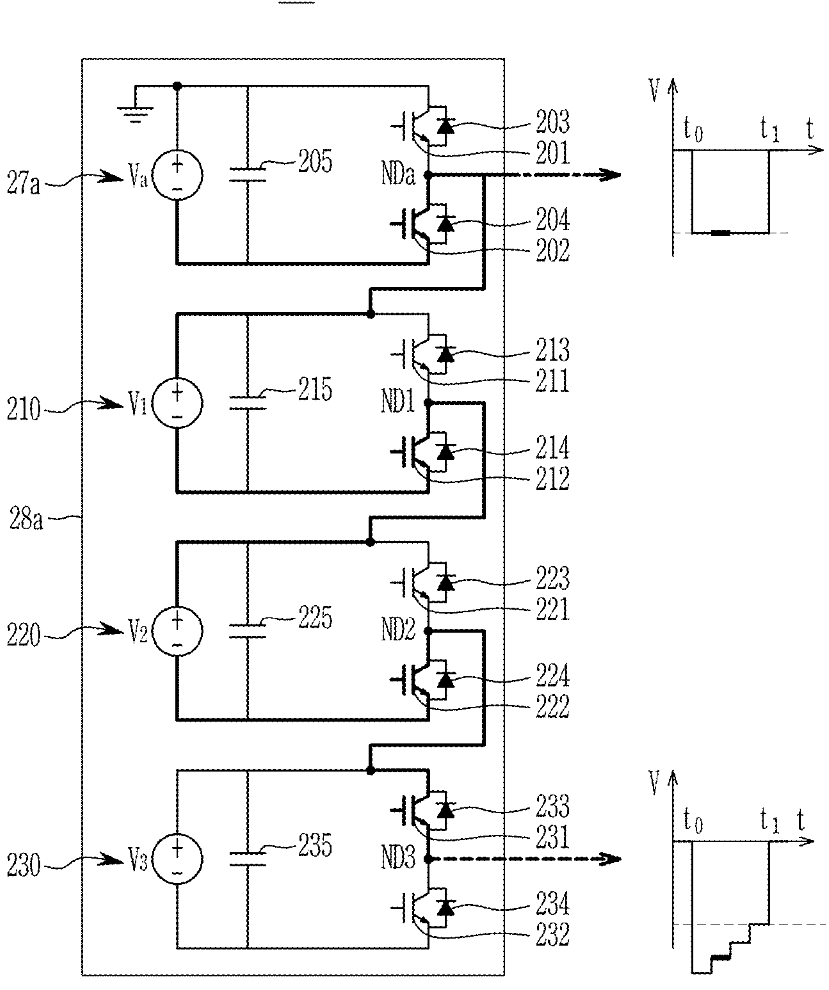
Figure 15:
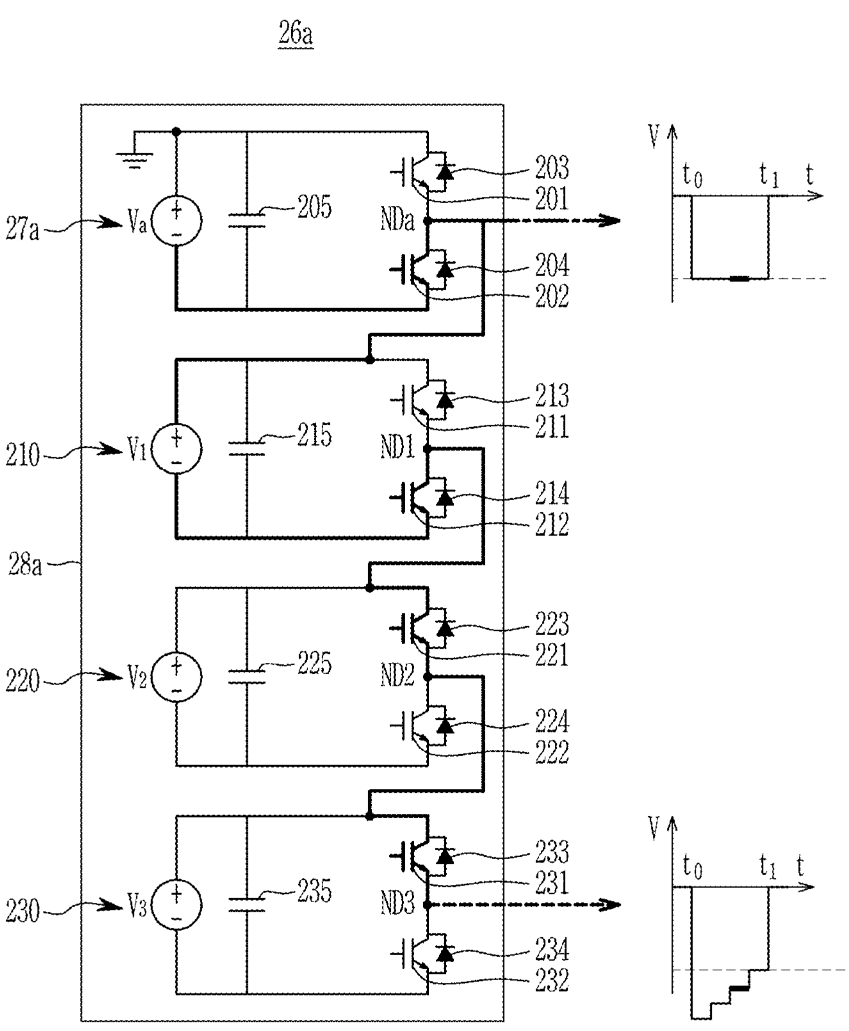
Figure 16:
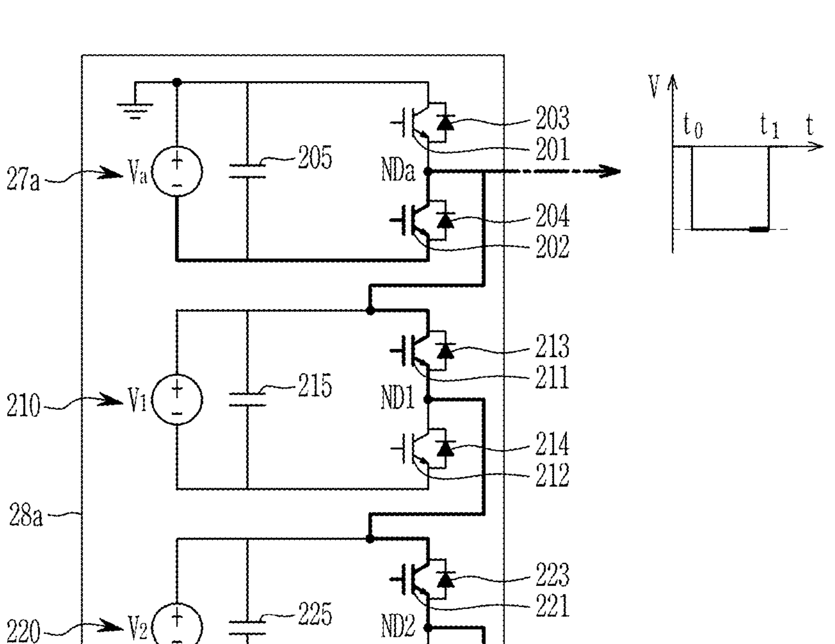

Referring to FIGS. 14 to 16, the first pulse power module 210, the second pulse power module 220, and the third pulse power module 230 are deactivated one by one and sequentially as time passes within the control period. While FIG. 14 to FIG. 16 illustrate an example that the third pulse power module 230, the second pulse power module 220, and the first pulse power module 210 are deactivated in that order, the order of deactivation of a plurality of pulse power modules 210, 220, 230 is not limited to this. For example, the pulse power module 210 may be inactivated first, or the second pulse power module 220 may be deactivated first. At this time, the center power supply unit 27*a* maintains the activated state.

Accordingly, during the control period, a negative level voltage with a magnitude corresponding to the center direct current power source Va is output to the output terminal of the center power supply unit 27*a*. During the control period, a negative level voltage corresponding to a sum of the edge direct current power sources V1, V2, V3 included in the pulse power modules 210, 220, 230 in the activated state and the center direct current power source Va is output at the output terminal of the edge power supply unit 28*a*. For example, during the control period, the voltage at the output terminal of the edge power supply unit 28*a* increases in the form of a step wave as the number of deactivated pulse power modules 210, 220, and 230 increases.

Figure 17:
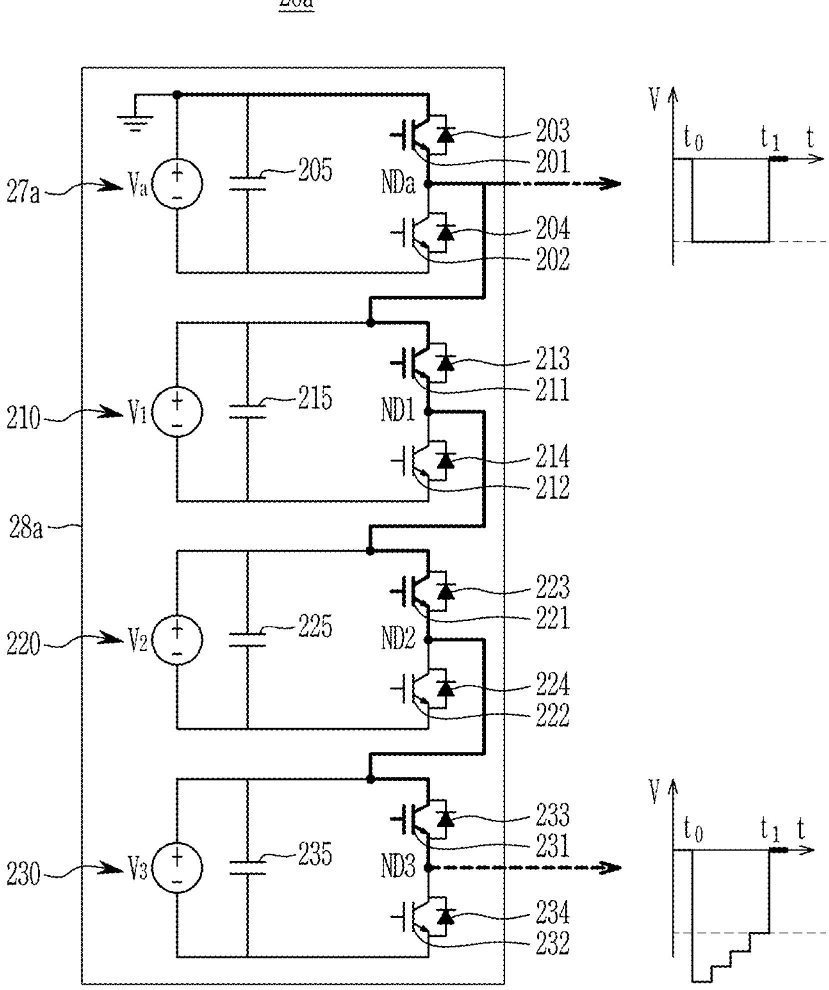

Referring to FIG. 17, when the control period ends and the reference period begins, all of the center power supply unit 27*a* and the pulse power modules 210, 220, and 230 are deactivated. Accordingly, 0V is output to the output terminal of the center power supply unit 27*a*, and 0V is output to the output terminal of the edge power supply unit 28*a*.

Figure 18:
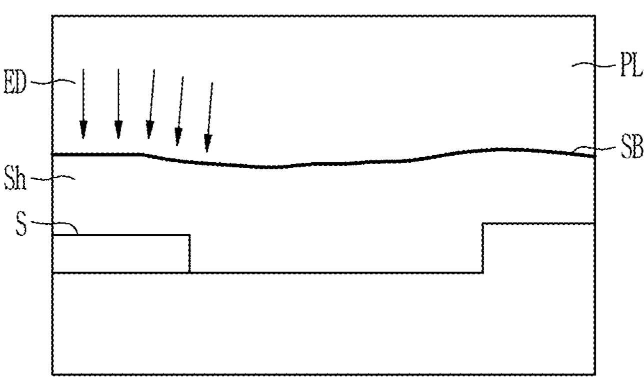
FIGS. 18 and 19 illustrate an incident direction of ions during processing a substrate.
Figure 19:
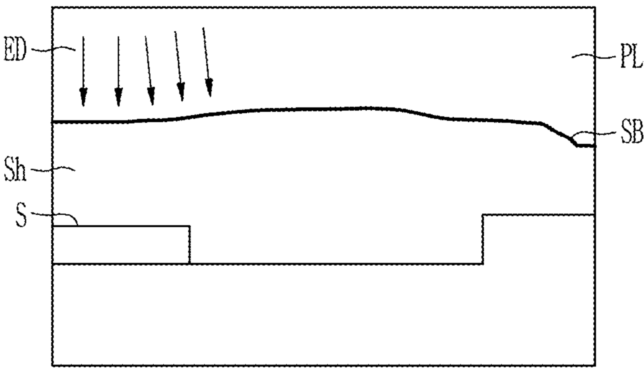

FIGS. 18 and 19 illustrate an incident direction ED of ions during processing a substrate S.

FIG. 18 and FIG. 19 illustrate an interface SB between sheath Sh and plasma PL at the edge region of the substrate S, and an incident direction ED of ions at the edge region of the substrate S.

Referring to FIG. 18 and FIG. 19, the sheath Sh is formed in a region where the plasma PL and an object are adjacent to each other.

The progress of ions is affected by the electric field generated in the sheath Sh. Accordingly, the incident direction ED of the ions incident to the substrate S becomes a direction approximately orthogonal to the interface SB between the sheath Sh and the plasma PL.

The interface SB between the sheath Sh and the plasma PL is lowered on an edge region of the substrate S and on an area disposed outside the edge of the substrate S. Due to the thickness of the substrate S, the upper surface of the area outside the edge of the substrate S is positioned lower than the upper surface of the substrate S. Accordingly, the incident direction ED of ions in the edge region of the substrate S is inclined toward the center of the substrate S with respect to the direction perpendicular to the upper surface of the substrate S. This inclination of incident direction ED of ions causes the etching direction of the substrate S to be inclined with respect to the direction perpendicular to the upper surface of the substrate S, and causes process defects.

To solve this problem, the height of the boundary surface SB can be increased in the area outside the edge of the substrate S by increasing the height of the top of the focus ring in the area outside the edge of the substrate S. However, the focus ring wears out during use, and the focus ring used for a certain period or a certain number of times is replaced.

In particular, the degree of wear of the focus ring increases with the number of processes performed, so there is a limit that the interface SB between the sheath Sh and the plasma PL changes with the wear of the focus ring even before the replacement cycle arrives.

Another method to solve this problem is to make the absolute value of the bias voltage applied to the edge region of the support member 20 greater than the absolute value of the bias voltage applied to the center region of the support member 20. The thickness of the sheath (Sh) increases as the absolute value of the voltage applied for bias increases.

A bias voltage applied for bias may be a square wave with a negative level. And the voltage applied to the edge region of the support member 20 is set to be smaller than the bias voltage applied to the center region of the support member 20. For example, the absolute value of the bias voltage applied to the edge region of the support member 20 is greater than the absolute value of the voltage applied to the center region of the support member 20. Accordingly, by increasing the thickness of the sheath Sh on the edge region of the support member 20, the interface SB between the sheath Sh and the plasma PL may be higher.

As bias voltages of different magnitude were applied to each of regions, in the state shown in FIG. 18 at a point when the bias voltage is started to be applied becomes the state shown in FIG. 19 when the bias voltage is continued to be applied. FIG. 19 shows a state at the point when application of the bias voltage that is a square wave is terminated.

In FIG. 19, the sheath Sh becomes thicker in the area positioned outside the edge of the substrate S, and the interface SB between the sheath Sh and the plasma PL is elevated. Furthermore, the interface SB between the sheath Sh and the plasma PL is elevated as the overall thickness of the sheath Sh, including the area positioned above the upper surface of the substrate S, increases. For example, the thickness of the sheath Sh increases excessively above the area outside the edge of the substrate S, so that, contrary to FIG. 18, the interface SB between the sheath Sh and the plasma PL in the edge region of the substrate S and the region outside the edge of the substrate S is higher than on adjacent regions. This occurs when ions are incident from the plasma PL toward the substrate S as the bias voltage is applied. Specifically, according to application of the bias voltage, the amount of ions incident in a direction from the plasma PL to the sheath Sh increases. Accordingly, the density of ions in an area adjacent to the sheath Sh decreases, so that the thickness of the sheath Sh increases while the boundary between the sheath Sh and the plasma PL moves toward the plasma PL. In addition, as the absolute value of the bias voltage applied to the edge region of the support member 20 is greater than the absolute value of the bias voltage applied to the center region of the support member 20, the amount of ions moving from the edge region of the support member 20 to the sheath Sh gets more. Accordingly, the thickness of the sheath Sh on the edge region of the support member 20 may increase excessively.

Accordingly, the incident direction ED of ions at the edge region of the substrate S is inclined in a direction opposite to the center of the substrate S with respect to a direction perpendicular to the upper surface of the substrate S. For example, with respect to a period when the bias voltage is applied, the incident direction ED of the ions changes from a state inclined toward the center of the substrate S to a state inclined in the direction opposite to the center of the substrate S. If the etching is performed in a state that the incident direction ED of the ions is changed, the etched portion has a distorted shape.

Figure 20:
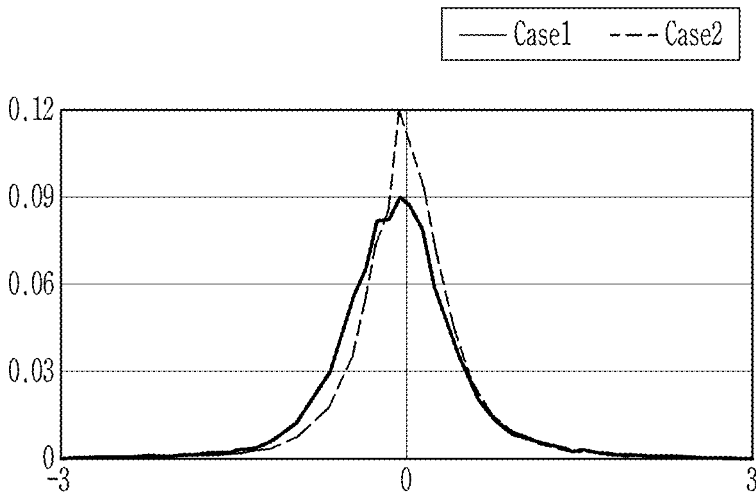
FIG. 20 is a graph comparing the distribution of incident directions of ions in the edge region of the substrate and FIG. 21 is a drawing illustrating a substrate processing apparatus according to one or more other embodiments.

FIG. 20 is a graph comparing the distribution of incident directions of ions in the edge region of the substrate.

The graph of case 1 is the distribution of the incident direction of ions when square waves are used for both a bias voltage in the center region and a bias voltage in the edge region as described above in FIGS. 18 and 19.

The graph of case 2 is a distribution of the incident direction of ions when the bias voltage in the center region uses a square wave and the bias voltage in the edge region uses a positive slope shape similar to the waveform shown in FIG. 2.

In cases 1 and 2, the bias voltage in the center region used the same waveform.

The bias voltage of the edge region used in case 2 was such that the edge start voltage had the same magnitude as the bias voltage of the edge region of case 1.

The horizontal axis is an angle at which the incident angle of ions is deviated from the direction perpendicular to the upper surface of the substrate. A positive value is an angle deviated in a direction toward the center of the substrate, and a negative value is an angle deviated in a direction opposite to the center of the substrate. The vertical axis is the ion distribution function.

Referring to FIG. 20, the distribution of the incident direction of ions in the edge region of the substrate is improved when a bias voltage is applied in such a way that a value obtained by subtracting the edge start voltage from the edge end voltage is greater than a value obtained by subtracting the center start voltage from the center end voltage.

This phenomenon results from the thickness of the sheath being prevented from excessively increasing in the edge region of the support member 20 by adjusting the speed of increase of the thickness of the sheath in the edge region of the support member 20 as the value subtracting the edge start voltage from the edge end voltage is set greater than the value subtracting the center start voltage from the center end voltage in the control period.

Figure 21:
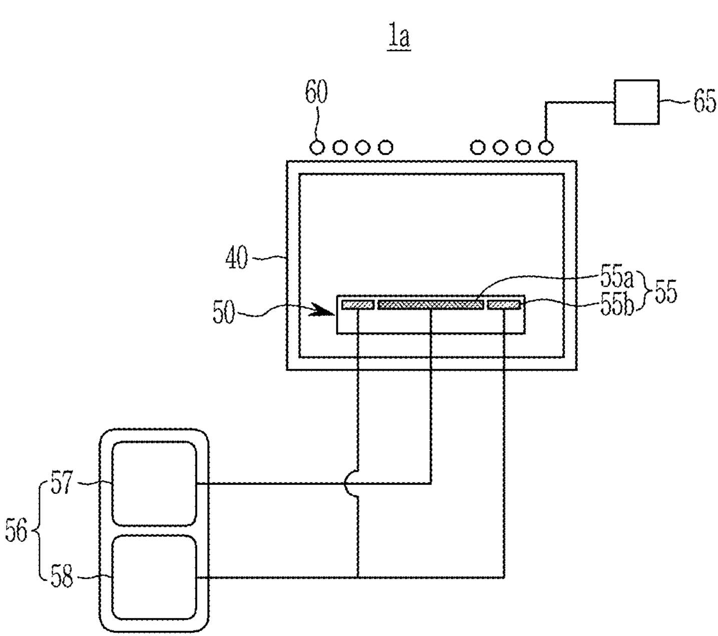

FIG. 21 is a drawing showing a substrate processing apparatus 1*a* according to another embodiment.

Referring to FIG. 21, a substrate processing apparatus 1*a* according to another embodiment includes a chamber 40, a support member 50, a plasma excitation member 60, and a bias power supply unit 56.

The chamber 40 is the same or similar to the chamber 10 described above in FIG. 1, so the repeated description is omitted.

The support member 50 is disposed inside the chamber 40. Except that the plasma excitation electrode 22 described above in FIG. 1 is omitted, the support member 50 is the same is or similar to the support member 20 described above in FIG. 1, so repeated descriptions are omitted.

A bias electrode 55 may be disposed inside the support member 50. The bias electrode 55 includes a center bias electrode 55*a* and an edge bias electrode 55*b*. Since the bias electrode 55 is the same is or similar to the bias electrode 25 described above in FIG. 1, repeated descriptions will be omitted.

A bias power supply unit 56 is connected to the bias electrode 55. The bias power supply unit 56 includes a center power supply unit 57 and an edge power supply unit 58. The bias power supply unit 56 may be the same as the bias power supply unit 26 described above in FIG. 1. Accordingly, the bias power supply unit 56 can output the waveforms described above in FIGS. 2 to 10. Additionally, the bias power supply unit 56 may have the circuit configuration described above in FIGS. 11 to 17. Repeated explanations for this will be omitted.

The plasma excitation member 60 enables energy for excitation of plasma to be applied to the process space. The plasma excitation member 60 may be disposed outside of the chamber 40. plasma excitation member 60 may be provided as antenna structure. The plasma excitation member 60 may be electrically connected to the source power supply unit 65. The source power supply unit 65 may be provided as a high-frequency power source that generates relatively high-frequency power. The source power supply unit 65 may be provided as RF power source. Accordingly, the plasma excitation member 60 generates electromagnetic waves for plasma excitation through the power provided by the source power supply unit 65. The plasma excitation member 60 may be disposed adjacent to the upper surface of the chamber 40. The plasma excitation member 60 may be disposed to face the upper surface of the chamber 40 in the vertical direction.

While embodiments have been described with reference to the figures, it will be understood by those of ordinary skill in the art that various changes in form and details may be made therein without departing from the spirit and scope as defined by the following claims and their equivalents.

What is claimed is:

1. A substrate processing apparatus comprising:
- a chamber;
- a support member inside the chamber;
- a center bias electrode at an inner center region of the support member;
- an edge bias electrode at an inner edge region of the support member;
- a center power supply unit connected to the center bias electrode and configured to output a center start voltage at a start point of a control period and a center end voltage at an end point of the control period; and
- an edge power supply unit connected to the edge bias electrode and configured to output an edge control voltage comprising an edge start voltage at the start point and an edge end voltage at the end point,
- wherein a value obtained by subtracting the edge start voltage from the edge end voltage is greater than a value obtained by subtracting the center start voltage from the center end voltage, and
- wherein an absolute value of the edge start voltage is greater than an absolute value of the edge end voltage.

2. The substrate processing apparatus of claim 1, wherein the edge control voltage and the center start voltage are negative values.

3. The substrate processing apparatus of claim 1, wherein an absolute value of the edge start voltage is greater than an absolute value of the center start voltage.

4. The substrate processing apparatus of claim 1, wherein an absolute value of the edge start voltage is greater than an absolute value of the center start voltage.

5. The substrate processing apparatus of claim 1, wherein a slope of the edge control voltage is between the edge start voltage and the edge end voltage.

6. The substrate processing apparatus of claim 1, wherein the edge control voltage has a curved shape that is convex upward in at least a portion between the edge start voltage and the edge end voltage.

7. The substrate processing apparatus of claim 1, wherein the edge control voltage has a curved shape that is convex downward in at least a portion between the edge start voltage and the edge end voltage.

8. The substrate processing apparatus of claim 1, wherein the edge control voltage has at least one inflection point between the edge start voltage and the edge end voltage.

9. The substrate processing apparatus of claim 1, wherein the edge control voltage has a step wave shape between the edge start voltage and the edge end voltage.

10. The substrate processing apparatus of claim 1, wherein the center power supply unit comprises:
- a center direct current (DC) power source;
- a deactivation switch between a positive terminal of the center DC power source and a center side node; and
- an activation switch between a negative terminal of the center DC power source and the center side node.

11. The substrate processing apparatus of claim 10, wherein the positive terminal of the center DC power source is grounded.

12. The substrate processing apparatus of claim 10, wherein at least one pulse power module is connected to the center power supply unit in a cascade structure.

13. The substrate processing apparatus of claim 12, wherein the at least one pulse power module comprises:
- an edge DC power source;
- a deactivation switch between a positive terminal of the edge DC power source and an edge node; and
- an activation switch between a negative terminal and the edge node.

14. The substrate processing apparatus of claim 12, wherein a plurality of the pulse power modules are activated simultaneously at the start point and deactivated sequentially as time passes during the control period.

15. A substrate processing apparatus comprising:
- a chamber;
- a support member inside the chamber;
- a center bias electrode at an inner center region of the support member;
- an edge bias electrode at an inner edge region of the support member;
- a center power supply unit connected to the center bias electrode and configured to output a center start voltage at a start point of a control period and a center end voltage at an end point of the control period; and
- an edge power supply unit connected to the edge bias electrode and configured to output an edge control voltage comprising an edge start voltage at the start point and an edge end voltage at the end point,
- wherein an angle of a straight line from the edge start voltage to the edge end voltage is a positive value and greater than an angle of a straight line from the center start voltage to the center end voltage.

16. The substrate processing apparatus of claim 15, wherein the edge control voltage has a negative value, and an output of the edge power supply unit is 0V during a period other than the control period of one cycle.

17. The substrate processing apparatus of claim 15, wherein the center start voltage has a negative value, and an output of the center power supply unit is 0V during a period other than the control period of one cycle.

18. The substrate processing apparatus of claim 15, wherein an absolute value of the edge start voltage is greater than an absolute value of the center start voltage.

19. The substrate processing apparatus of claim 15, wherein an absolute value of the edge start voltage is greater than an absolute value of the center end voltage.

20. A substrate processing apparatus comprising:
- a chamber comprising a process space;
- a support member inside the chamber;

a plasma excitation member configured to apply energy to excite plasma within the process space;

a center bias electrode at an inner central region of the support member;

an edge bias electrode at an inner edge region of the support member;

a center power supply unit connected to the center bias electrode and configured to output a center start voltage at a start point of a control period and a center end voltage at an end point of the control period; and an edge power supply unit connected to the edge bias electrode and configured to output an edge start voltage at the start point and an edge end voltage at the end point, wherein a value obtained by subtracting the edge start voltage from the edge end voltage is greater than a value obtained by subtracting the center start voltage from the center end voltage, and an absolute value of the edge start voltage is greater than an absolute value of the center start voltage, and wherein an absolute value of the edge start voltage is greater than an absolute value of the edge end voltage.

* * * * *